US009035367B2

(12) United States Patent
Derkacs

(10) Patent No.: US 9,035,367 B2
(45) Date of Patent: May 19, 2015

(54) METHOD FOR MANUFACTURING INVERTED METAMORPHIC MULTIJUNCTION SOLAR CELLS

(71) Applicant: Daniel Derkacs, Albuquerque, NM (US)

(72) Inventor: Daniel Derkacs, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 105 days.

(21) Appl. No.: 14/052,454

(22) Filed: Oct. 11, 2013

(65) Prior Publication Data

US 2015/0104898 A1 Apr. 16, 2015

(51) Int. Cl.
*H01L 29/76* (2006.01)
*H01L 31/0687* (2012.01)
*H01L 31/18* (2006.01)

(52) U.S. Cl.
CPC ...... *H01L 31/06875* (2013.01); *H01L 31/1892* (2013.01); *H01L 31/1844* (2013.01)

(58) Field of Classification Search
CPC .............................. H01L 31/188; H01L 31/076
USPC ......................................................... 257/288
See application file for complete search history.

(56) References Cited

U.S. PATENT DOCUMENTS

2015/0040971 A1* 2/2015 Stan et al. ..................... 136/255

* cited by examiner

*Primary Examiner* — Mohammad Islam
*Assistant Examiner* — Ankush Singal

(57) ABSTRACT

A method of fabricating both a multijunction solar cell and an inverted metamorphic multijunction solar cell in a single process using a MOCVD reactor by forming a first multijunction solar cell on a semiconductor substrate; forming a release layer over the first solar cell; forming an inverted metamorphic second solar cell over the release layer; and etching the release layer so as to separate the multijunction first solar cell and the inverted metamorphic second solar cell.

20 Claims, 26 Drawing Sheets

METHOD FOR MANUFACTURING INVERTED METAMORPHIC MULTIJUNCTION SOLAR CELLS

BACKGROUND OF THE INVENTION

1. Field of the Invention

The present disclosure relates to solar cells and the fabrication of solar cells, and more particularly to a method for fabricating both standard multijunction solar cells and inverted metamorphic multijunction (IMM) solar cells based on III-V semiconductor compounds in a single MOCVD process.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, the power-to-weight ratio of a solar cell becomes increasingly more important, and there is increasing interest in lighter weight, "thin film" type solar cells having both high efficiency and low mass.

The efficiency of energy conversion, which converts solar energy (or photons) to electrical energy, depends on various factors such as the design of solar cell structures, the choice of semiconductor materials, and the thickness of each cell. In short, the energy conversion efficiency for each solar cell is dependent on the optimum utilization of the available sunlight across the solar spectrum. As such, the characteristic of sunlight absorption in semiconductor material, also known as photovoltaic properties, is critical to determine the most efficient semiconductor to achieve the optimum energy conversion.

Typical III-V compound semiconductor solar cells are fabricated on a semiconductor wafer in vertical, multijunction structures or stacked sequence of solar subcells, each subcell formed with appropriate semiconductor layers and including a p-n photoactive junction. Each subcell is designed to convert photons over different spectral or wavelength bands to electrical current. After the sunlight impinges on the front of the solar cell, and photons pass through the subcells, the photons in a wavelength band that are not absorbed and converted to electrical energy in the region of one subcell propagate to the next subcell, where such photons are intended to be captured and converted to electrical energy, assuming the downstream subcell is designed for the photon's particular wavelength or energy band.

The individual solar cells or wafers are then disposed in horizontal arrays, with the individual solar cells connected together in an electrical series and/or parallel circuit. The shape and structure of an array, as well as the number of cells it contains, are determined in part by the desired output voltage and current.

The energy conversion efficiency of multijunction solar cells is affected by such factors as the number of subcells, the thickness of each subcell, and the band structure, electron energy levels, conduction, and absorption of each subcell. Factors such as the short circuit current density ($J_{sc}$), the open circuit voltage ($V_{oc}$), and the fill factor are also important.

One of the important mechanical or structural considerations in the choice of semiconductor layers for a solar cell is the desirability of the adjacent layers of semiconductor materials in the solar cell, i.e. each layer of crystalline semiconductor material that is deposited and grown to form a solar subcell, have similar crystal lattice constants or parameters.

Many III-V devices, including solar cells, are fabricated by thin epitaxial growth of III-V compound semi conductors upon a relatively thick substrate. The substrate, typically of Ge, GaAs, InP, or other bulk material, acts as a template for the formation of the deposited epitaxial layers. The atomic spacing or lattice constant in the epitaxial layers will generally conform to that of the substrate, so the choice of epitaxial materials will be limited to those having a lattice constant similar to that of the substrate material.

However, in order to improve the efficiency of a solar cell even further, the present disclosure proposes additional design features that have heretofore not been considered.

SUMMARY OF THE INVENTION

Objects of the Invention

It is an object of the present invention to provide efficiency in a multijunction solar cell.

It is another object of the present invention to provide to a means to fabricate two separate multijunction solar cells in a single epitaxial growth run.

It is another object of the present invention to fabricate two separate multijunction solar cells from a single substrate.

It is another object of the present disclosure to provide a means to substantially reduce the cost of fabricating a standard upright multijunction solar cell and an inverted multijunction solar cell by eliminating the additional substrate normally required to grow the inverted multijunction solar cell. Furthermore, machine throughput is increased as the time it takes to ramp down temperature and ramp up temperature between growths is eliminated as two growths are performed in a single growth run.

Some implementations of the present disclosure may incorporate or implement fewer of the aspects and features noted in the foregoing objects.

Features of the Invention

Briefly, and in general terms, the present disclosure provides a method of fabricating both a multijunction solar cell and an inverted metamorphic multijunction solar cell in a single process using a MOCVD reactor comprising providing a semiconductor substrate; forming a first multijunction solar cell on said semiconductor substrate; forming a release layer over the first solar cell; forming an inverted metamorphic second solar cell including growing a first solar subcell having a first band gap on said release layer; growing a second solar subcell over said first subcell having a second band gap smaller than said first band gap; growing a first grading interlayer over said second solar subcell; growing a third solar subcell over said grading interlayer having a fourth band gap smaller than said second band gap such that said third solar subcell is lattice mismatched with respect to said second solar subcell; and etching the release layer so as to separate the multijunction first solar cell and the inverted metamorphic second solar cell.

In some embodiments, the substrate is a germanium substrate.

In some embodiments, forming a first multijunction solar cell further comprises forming a first photoactive junction in said substrate to form a bottom solar subcell; forming a gallium arsenide middle cell disposed on said substrate; and forming an indium gallium phosphide top cell disposed over said middle cell.

In some embodiments, forming an inverted metamorphic second solar cell further comprises forming a second graded interlayer adjacent to said third solar subcell; said second graded interlayer having a fifth band gap greater than said fourth band gap; forming a lower fourth solar subcell adjacent to said second graded interlayer, said lower subcell having a sixth band gap smaller than said fourth band gap such that said fourth subcell is lattice mismatched with respect to said third subcell; and mounting a surrogate substrate on top of fourth solar sub cell.

In some embodiments, the lower fourth subcell has a band gap in the range of 0.6 to 0.8 eV; the third subcell has a band gap in the range of 0.9 to 1.1 eV, the second subcell has a band gap in the range of 1.35 to 1.45 eV, and the first subcell has a band gap in the range of 1.8 to 2.1 eV.

In some embodiments, the surrogate substrate is composed of sapphire, GaAs, glass, Ge or Si.

In some embodiments, the first graded interlayer is compositionally graded to lattice match the second subcell on one side and the third subcell on the other side, and the second graded interlayer is compositionally graded to lattice match the third subcell on one side and the bottom fourth subcell on the other side.

In some embodiments, the first graded interlayer is composed of any of the As, P, N, Sb based III-V compound semiconductors subject to the constraints of having the in-plane lattice parameter greater or equal to that of the second subcell and less than or equal to that of the third subcell, and having a band gap energy greater than that of the second subcell and of the third sub cell.

In some embodiments, the second graded interlayer is composed of any of the As, P, N, Sb based III-V compound semiconductors subject to the constraints of having the in-plane lattice parameter greater or equal to that of the third subcell and less than or equal to that of the bottom fourth subcell, and having a band gap energy greater than that of the third subcell and of the fourth subcell.

In some embodiments, the first and second graded interlayers are composed of $(In_xGa_{1-x})_y Al_{1-y}As$ with $0<x<1$, $0<y<1$, and x and y selected such that the band gap of each interlayer remains constant throughout its thickness.

In some embodiments, the band gap of the first graded interlayer remains constant at 1.51 eV, and the band gap of the second graded interlayer remains constant at 1.1 eV.

In some embodiments, the first subcell is composed of an InGaP emitter layer and an InGaP base layer, the second subcell is composed of InGaP emitter layer and a InGaAs base layer, the third subcell is composed of an InGaP emitter layer and an InGaAs base layer, and the bottom fourth subcell is composed of an InGaAs base layer and an InGaAs emitter layer lattice matched to the base layer.

In some embodiments, the release layer is composed of AlAs or AlGaAs.

In some embodiments, etching the release layers utilizes a hydrofluoric wet etch.

In some embodiments, a semiconductor contact layer is disposed over the lower subcell of the second solar cell, and a metal layer is disposed over the contact layer.

In some embodiments, the metal layer has a stress that is opposite in sign from the strain in the layers comprising the second solar cell.

In some embodiments, the metal layer includes a first layer adjacent to the contact layer composed of titanium or nickel, and a second layer adjacent to the first layer composed of silver.

In some embodiments, the metal layer is from 5 to 15 microns in thickness.

In some embodiments, the deposition of the metal layer is controlled so that the deposited metal layer bows the adjacent semiconductor structure so the epitaxial layers deposited over the release layer are pulled away from the release layer.

In some embodiments, the metal layer is deposited by RF sputtering.

In some embodiments, the stress in the metal layer is controlled by adjusting deposition parameters including deposition rate, substrate temperature, and layer thickness so as to introduce tensile rather than compressive stress.

In some embodiments, the stress in the metal layer is controlled by adjusting the RF sputtering power so as to introduce tensile rather than compressive stress.

In some embodiments, the metal layer is composed of a sequence of layers including Ti/Pt/Ag, Ti/Ni/Ag, Ni/Pt/Ag, Cr/Ni/Ag, Ni/Ag, Cr/Ag, or Ti/Ag.

In some embodiments, a layer of tensile material is deposited over the bottom subcell of the inverted metamorphic second solar cell.

In some embodiments, the layer of tensile material is nickel or silver with a thickness of 5 to 15 microns.

In some embodiments, additional layer(s) may be added or deleted in the cell structure without departing from the scope of the present disclosure.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

DESCRIPTION OF THE PREFERRED EMBODIMENT

Figure 1:
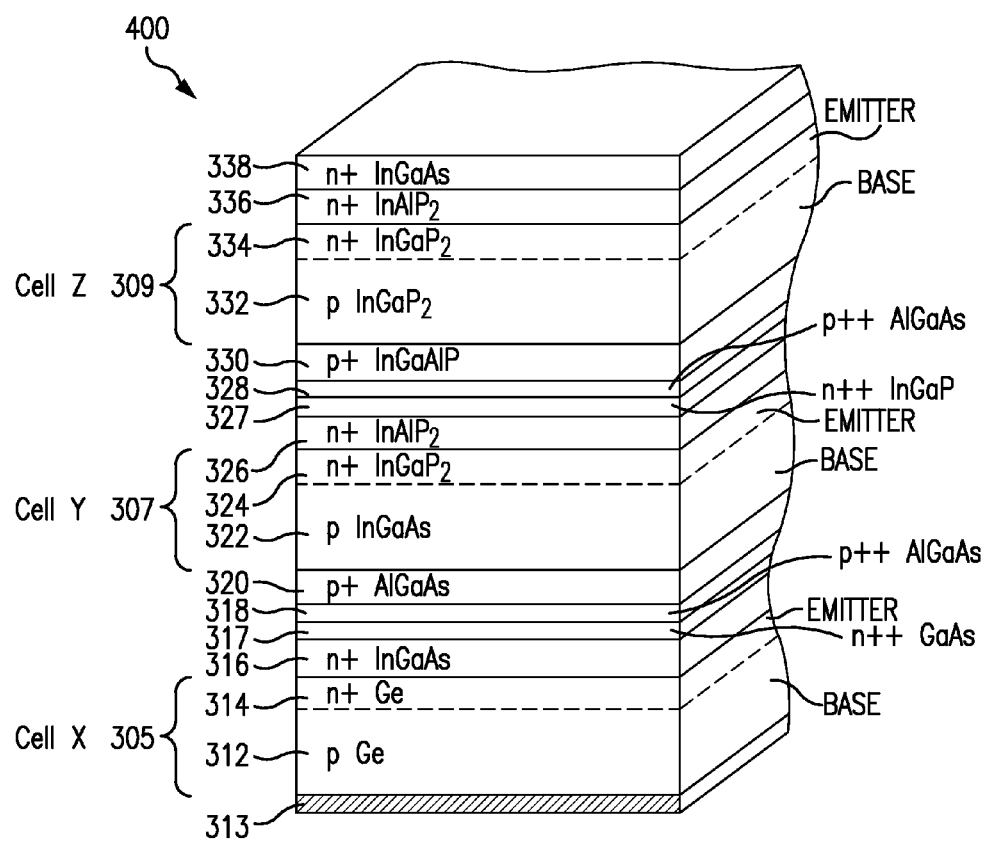
FIG. 1 is a cross-sectional view of a triple junction first solar cell (comprising subcells X, Y, and Z) after the initial deposition of semiconductor layers on the growth substrate.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

A variety of different features of multijunction solar cells and inverted metamorphic multijunction solar cells are disclosed in the related applications noted above. Some, many or all of such features may be included in the structures and processes associated with the solar cells of the present disclosure. More generally, however, the present disclosure may be adapted to inverted metamorphic multijunction solar cells as disclosed in the parent application and its related applications that may include three, four, five, or six subcells, with band gaps in the range of 1.8 to 2.2 eV (or higher) for the top subcell, and 1.3 to 1.8 eV, 0.9 to 1.2 eV for the middle subcells, and 0.6 to 0.8 eV, for the bottom subcell, respectively.

More specifically, the present disclosure intends to provide a relatively simple and reproducible technique that is suitable for use in a high volume production environment in which various semiconductor layers are deposited in an MOCVD reactor, and subsequent processing steps are defined and selected to minimize any physical damage to the quality of the deposited layers, thereby ensuring a relatively high yield of operable solar cells meeting specifications at the conclusion of the fabrication processes.

Prior to discussing the specific embodiments of the present disclosure, a brief discussion of some of the issues associated with the design of multijunction solar cells, and in particular inverted metamorphic solar cells, and the context of the composition or deposition of various specific layers in embodiments of the product as specified and defined by Applicant is in order.

There are a multitude of properties that should be considered in specifying and selecting the composition of, inter alia, a specific semiconductor layer, the back metal layer, the adhesive or bonding material, or the composition of the supporting material for mounting a solar cell thereon. For example, some of the properties that should be considered when selecting a particular layer or material are electrical properties (e.g. conductivity), optical properties (e.g., band gap, absorbance and reflectance), structural properties (e.g., thickness, strength, flexibility, Young's modulus, etc.), chemical properties (e.g., growth rates, the "sticking coefficient" or ability of one layer to adhere to another, stability of dopants and constituent materials with respect to adjacent layers and subsequent processes, etc.), thermal properties (e.g., thermal stability under temperature changes, coefficient of thermal expansion), and manufacturability (e.g., availability of materials, process complexity, process variability and tolerances, reproducibility of results over high volume, reliability and quality control issues).

In view of the trade-offs among these properties, it is not always evident that the selection of a material based on one of its characteristic properties is always or typically "the best" or "optimum" from a commercial standpoint or for Applicant's purposes. For example, theoretical studies may suggest the use of a quaternary material with a certain band gap for a particular subcell would be the optimum choice for that subcell layer based on fundamental semiconductor physics. As an example, the teachings of academic papers and related proposals for the design of very high efficiency (over 40%) solar cells may therefore suggest that a solar cell designer specify the use of a quaternary material (e.g., InGaAsP) for the active layer of a subcell. A few such devices may actually be fabricated by other researchers, efficiency measurements made, and the results published as an example of the ability of such researchers to advance the progress of science by increasing the demonstrated efficiency of a compound semiconductor multijunction solar cell. Although such experiments and publications are of "academic" interest, from the practical perspective of the Applicants in designing a compound semiconductor multijunction solar cell to be produced in high volume at reasonable cost and subject to manufacturing tolerances and variability inherent in the production processes, such an "optimum" design from an academic perspective is not necessarily the most desirable design in practice, and the teachings of such studies more likely than not point in the wrong direction and lead away from the proper design direction. Stated another way, such references may actually "teach away" from Applicant's research efforts and the ultimate solar cell design proposed by the Applicants.

In view of the foregoing, it is further evident that the identification of one particular constituent element (e.g. indium, or aluminum) in a particular subcell, or the thickness, band gap, doping, or other characteristic of the incorporation of that material in a particular subcell, is not a "result effective variable" that one skilled in the art can simply specify and incrementally adjust to a particular level and thereby increase the efficiency of a solar cell. The efficiency of a solar cell is not a simple linear algebraic equation as a function of the amount of gallium or aluminum or other element in a particular layer. The growth of each of the epitaxial layers of a solar cell in an MOCVD reactor is a non-equilibrium thermodynamic process with dynamically changing spatial and temporal boundary conditions that is not readily or predictably modeled. The formulation and solution of the relevant simultaneous partial differential equations covering such processes are not within the ambit of those of ordinary skill in the art in the field of solar cell design.

Even when it is known that particular variables have an impact on electrical, optical, chemical, thermal or other characteristics, the nature of the impact often cannot be predicted with much accuracy, particularly when the variables interact in complex ways, leading to unexpected results and unintended consequences. Thus, significant trial and error, which may include the fabrication and evaluative testing of many prototype devices, often over a period of time of months if not years, is required to determine whether a proposed structure with layers of particular compositions, actually will operate as intended, let alone whether it can be fabricated in a reproducible high volume manner within the manufacturing tolerances and variability inherent in the production process, and necessary for the design of a commercially viable device.

Furthermore, as in the case here, where multiple variables interact in unpredictable ways, the proper choice of the combination of variables can produce new and unexpected results, and constitute an "inventive step".

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), or other vapor deposition methods for the growth may enable the layers in the monolithic semiconductor structure forming the cell to be grown with the required thickness, elemental composition, dopant concentration and grading and conductivity type.

The present disclosure is directed to a growth process using a metal organic chemical vapor deposition (MOCVD) process in a standard, commercially available reactor suitable for high volume production. More particularly, the present disclosure is directed to the materials and fabrication steps that are particularly suitable for producing commercially viable multijunction solar cells or inverted metamorphic multijunction solar cells using commercially available equipment and established high-volume fabrication processes, as contrasted with merely academic expositions of laboratory or experimental results.

It should be noted that the layers of a certain target composition in a semiconductor structure grown in an MOCVD process are inherently physically different than the layers of an identical target composition grown by another process, e.g. Molecular Beam Epitaxy (MBE). The material quality (i.e., morphology, stoichiometry, number and location of lattice traps, impurities, and other lattice defects) of an epitaxial layer in a semiconductor structure is different depending upon the process used to grow the layer, as well as the process parameters associated with the growth. MOCVD is inherently a chemical reaction process, while MBE is a physical deposition process. The chemicals used in the MOCVD process are present in the MOCVD reactor and interact with the wafers in the reactor, and affect the composition, doping, and other physical, optical and electrical characteristics of the material. For example, the precursor gases used in an MOCVD reactor (e.g. hydrogen) are incorporated into the resulting processed wafer material, and have certain identifiable electro-optical consequences which are more advantageous in certain specific applications of the semiconductor structure, such as in photoelectric conversion in structures designed as solar cells. Such high order effects of processing technology do result in relatively minute but actually observable differences in the material quality grown or deposited according to one process technique compared to another. Thus, devices fabricated at least in part using an MOCVD reactor or using a MOCVD process have inherent different physical material characteristics, which may have an advantageous effect over the identical target material deposited using alternative processes.

FIG. 1 illustrates a particular example of the initial layers of a triple junction solar cell device 400, comprising subcells X, Y and Z. In the Figure, each dashed line indicates the active region junction between a base layer and emitter layer of a subcell.

As shown in the illustrated example of FIG. 1, the bottom subcell 305 includes a substrate 312 formed of p-type germanium ("Ge") which also serves as a base layer. A contact pad 313 formed on the bottom of base layer 312 provides electrical contact to the multijunction solar cell 303. The bottom subcell 305 further includes, for example, a highly doped n-type Ge emitter layer 314, and an n-type indium gallium arsenide ("InGaAs") nucleation layer 316. The nucleation layer is deposited over the base layer 312, and the emitter layer is formed in the substrate by diffusion of deposits into the Ge substrate, thereby forming the n-type Ge layer 314. Heavily doped p-type aluminum gallium arsenide ("AlGaAs") and heavily doped n-type gallium arsenide ("GaAs") tunneling junction layers 318, 317 may be deposited over the nucleation layer 316 to provide a low resistance pathway between the bottom and middle subcells.

In the illustrated example of FIG. 1, the middle subcell 307 includes a highly doped p-type aluminum gallium arsenide ("AlGaAs") back surface field ("BSF") layer 320, a p-type InGaAs base layer 322, a highly doped n-type indium gallium phosphide ("InGaP$_2$") emitter layer 324 and a highly doped n-type indium aluminum phosphide ("AlInP$_2$") window layer 326. The InGaAs base layer 322 of the middle subcell 307 can include, for example, approximately 1.5% In. Other compositions may be used as well. The base layer 322 is formed over the BSF layer 320 after the BSF layer is deposited over the tunneling junction layers 318 of the bottom subcell 304.

The BSF layer 320 is provided to reduce the recombination loss in the middle subcell 307. The BSF layer 320 drives minority carriers from a highly doped region near the back surface to minimize the effect of recombination loss. Thus, the BSF layer 320 reduces recombination loss at the backside of the solar cell and thereby reduces recombination at the base layer/BSF layer interface. The window layer 326 is deposited on the emitter layer 324 of the middle subcell B. The window layer 326 in the middle subcell B also helps reduce the recombination loss and improves passivation of the cell surface of the underlying junctions. Before depositing the layers of the top cell C, heavily doped n-type InGaP and p-type AlGaAs tunneling junction layers 327, 328 may be deposited over the middle subcell B.

In the illustrated example, the top subcell 309 includes a highly doped p-type indium gallium aluminum phosphide ("InGaAlP") BSF layer 330, a p-type InGaP$_2$ base layer 332, a highly doped n-type InGaP$_2$ emitter layer 334 and a highly doped n-type InAlP$_2$ window layer 336. The base layer 332 of the top subcell 309 is deposited over the BSF layer 330 after the BSF layer 330 is formed over the tunneling junction layers 328 of the middle subcell 307. The window layer 336 is deposited over the emitter layer 334 of the top subcell after the emitter layer 334 is formed over the base layer 332. A cap or contact layer 338 may be deposited and patterned into separate contact regions over the window layer 336 of the top subcell 308. The cap or contact layer 338 serves as an electrical contact from the top subcell 309 to metal grid layer 340. The doped cap or contact layer 338 can be a semiconductor layer such as, for example, a GaAs or InGaAs layer.

As more fully described in U.S. patent application Ser. No. 12/218,582 filed Jul. 18, 2008, hereby incorporated by reference, the grid lines 340 are preferably composed of Ti/Au/Ag/Au, although other suitable materials may be used as well.

Figure 2:
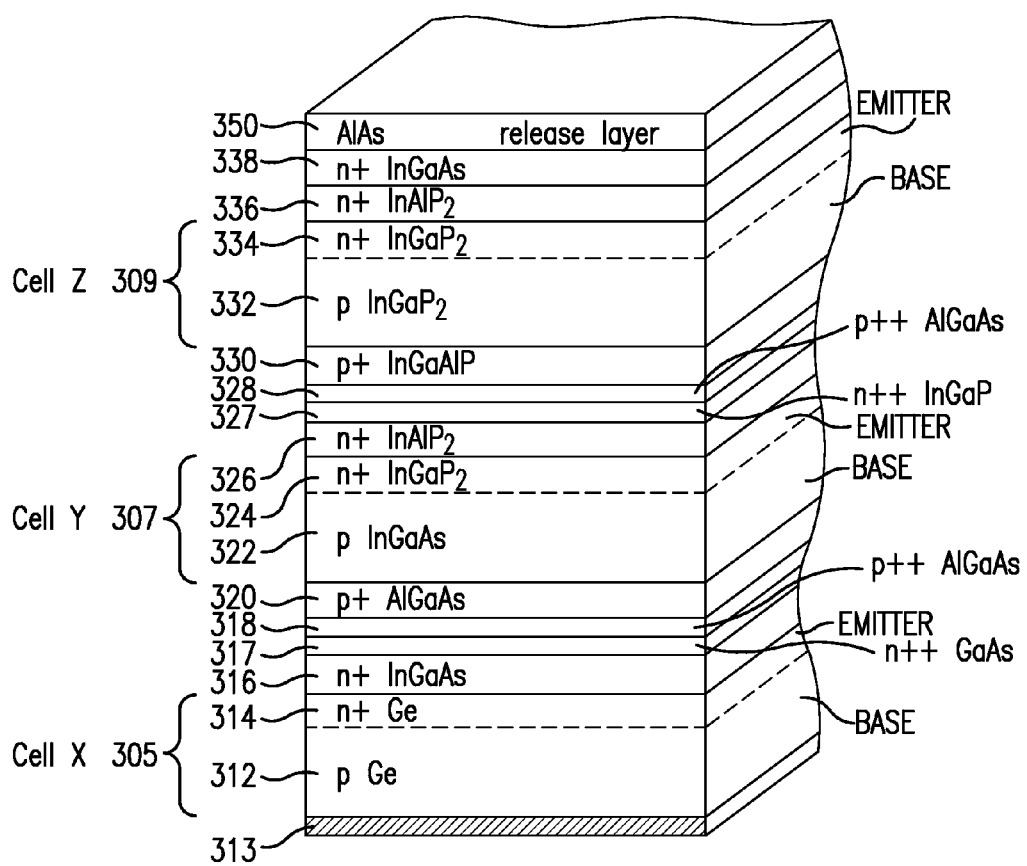
FIG. 2 is a cross-sectional view of the solar cell of FIG. 1 according to the present disclosure after deposition of release layer over the top layer of the first solar cell; The release layer 350 may be AlAs, AlGaAs, or other suitable III-V compound semiconductor material which permits a highly selective etch to be performed in subsequent processing of the epitaxial structure.

FIG. 2 is a cross-sectional view of the solar cell 400 of FIG. 1 according to the present disclosure after deposition of release layer 350 over the top layer 338 of the first solar cell. The release layer 350 may be AlAs, GaAlAs, or other suitable III-V compound semiconductor material which permits a highly selective etch to be performed after subsequent processing of the epitaxial structure to be formed. The release layer 350 is designed to have a lattice constant which is substantially similar to that of the lower layer 338 and the subsequently grown layers.

Figure 3A:
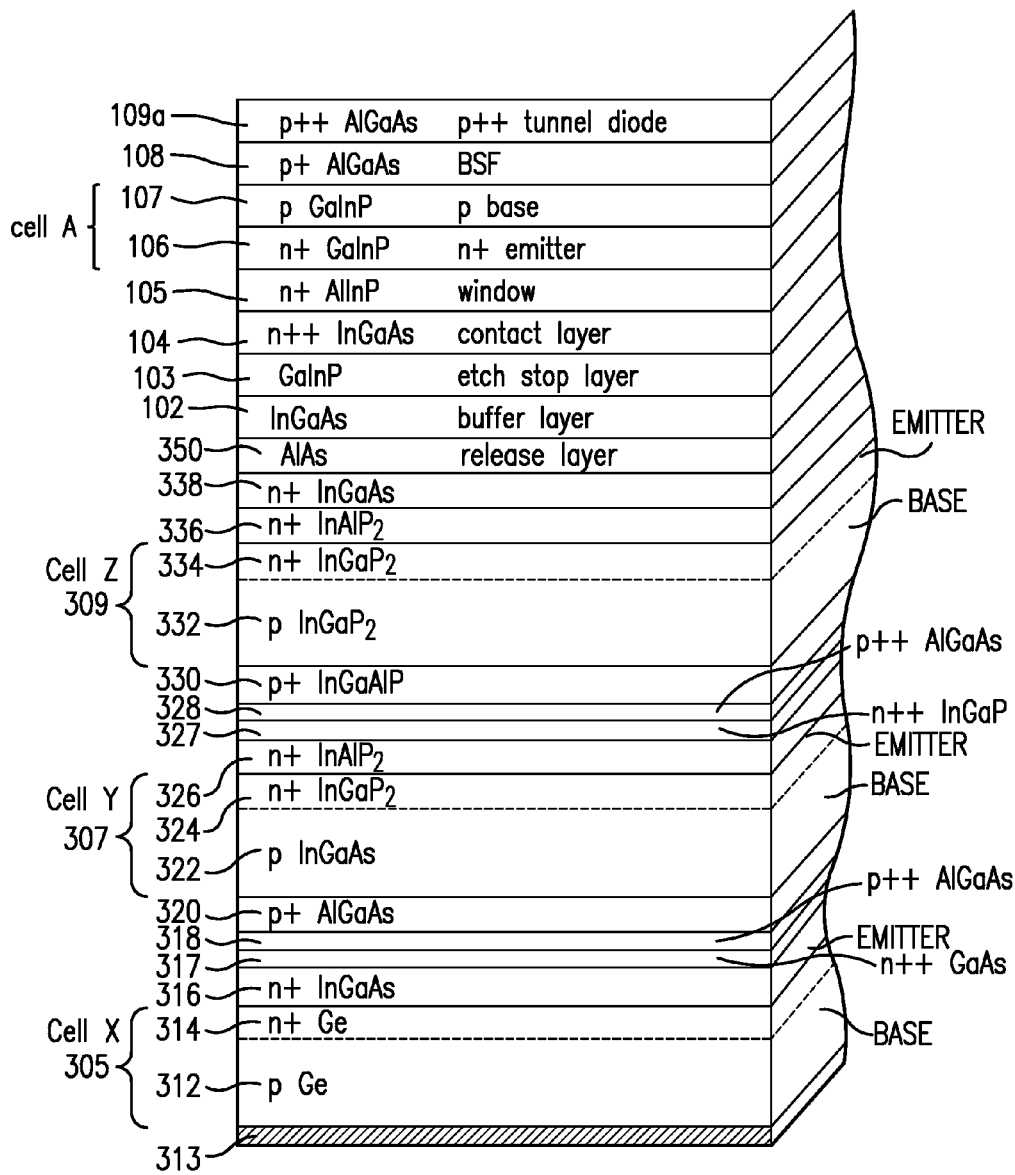
FIGS. 3A and 3B is a cross-sectional view of the solar cell of FIG. 2B after growth of a four junction inverted metamorphic second solar cell over the first solar cell.
Figure 3B:
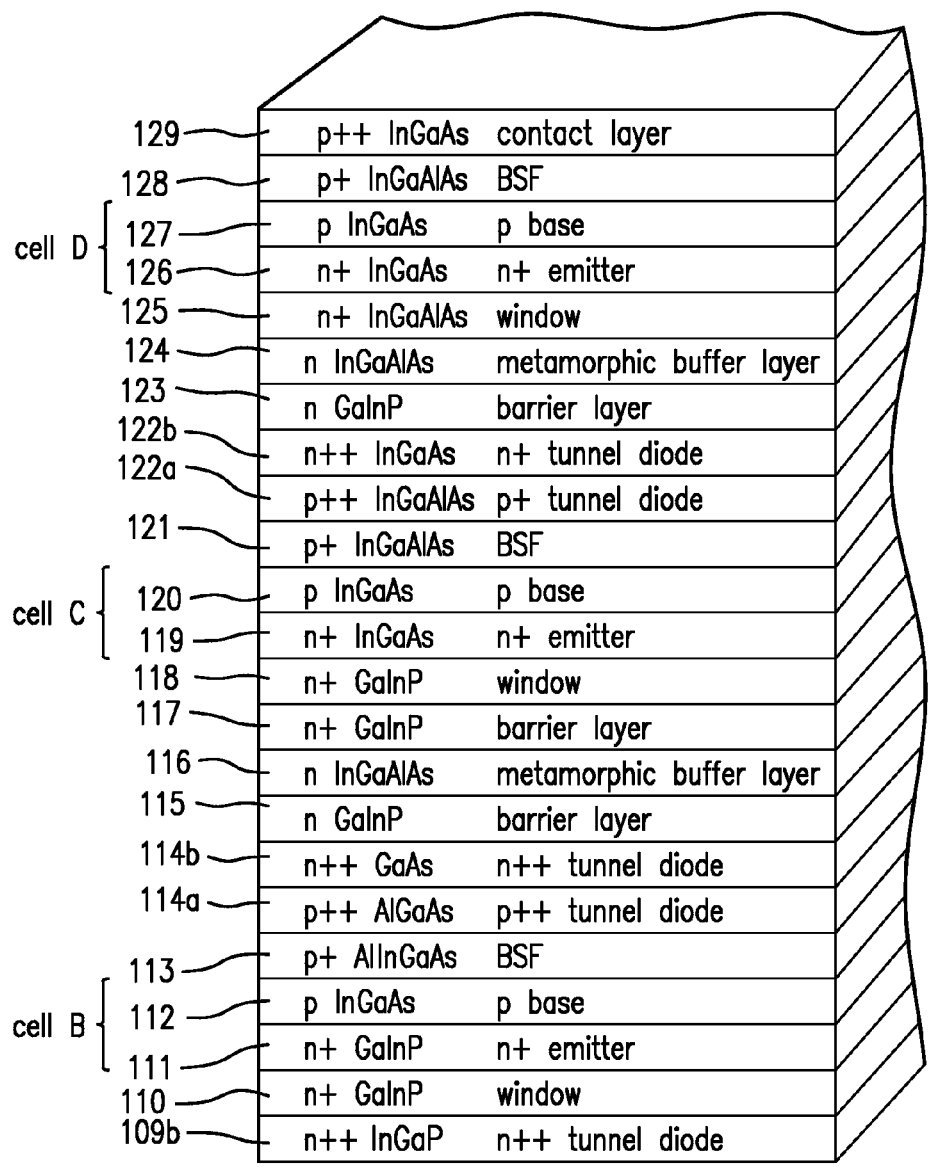

FIGS. 3A and 3B is a cross-sectional view of the solar cell of FIG. 2B after growth of a four junction inverted metamorphic multijunction second solar cell, comprising subcells A, B, C and D, over the first solar cell 400. FIGS. 3A and 3B depict the layers of a four junction solar cell generally of the type as set forth in U.S. patent application Ser. No. 12/271,192 filed Nov. 14, 2008, herein incorporated by reference.

Although the Figures illustrate a vertical stack of three subcells for the first solar cell 400, and four subcells for the second solar cell, various aspects and features of the present disclosure can apply to stacks with fewer or greater number of subcells, i.e. two junction cells, four junction cells, five, six, seven junction cells, etc. For further illustration of such embodiments of inverted metamorphic multijunction second solar cells, U.S. patent application Ser. No. 13/401,181 filed Feb. 21, 2012, is herein incorporated by reference.

A buffer layer 102 and an etch stop layer 103 are deposited over the etch release layer 350. The buffer layer 102 is InGaAs, or other suitable material. The etch stop layer 103 is GaInP, or other suitable material. A contact layer 104 of InGaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally lattice matched to the etch release layer 350.

It should be noted that the multijunction solar cell structure could be formed by any suitable combination of group III to V elements listed in the periodic table subject to lattice constant and band gap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorus (P), arsenic (As), antimony (Sb), and bismuth (Bi).

In one embodiment, the emitter layer 106 is composed of GaInP and the base layer 107 is composed of AlGaInP. In some embodiments, more generally, the base-emitter junction may be a heterojunction. In other embodiments, the base layer may be composed of (Al)GaInP, where the aluminum or Al term in parenthesis in the preceding formula means that Al is an optional constituent, and in this instance may be used in an amount ranging from 0% to 30%. The doping profile of the emitter and base layers 106 and 107 according to the present invention will be discussed in conjunction with FIG. 18.

In some embodiments, the band gap of the base layer 107 is 1.91 eV or greater.

Subcell A will ultimately become the "top" subcell of the inverted metamorphic structure after completion of the process steps according to the present invention to be described hereinafter.

On top of the base layer 107 a back surface field ("BSF") layer 108 preferably p+ AlGaInP is deposited and used to reduce recombination loss.

The BSF layer 108 drives minority carriers from the region near the base/BSF interface surface to minimize the effect of recombination loss. In other words, the BSF layer 18 reduces recombination loss at the backside of the solar subcell A and thereby reduces the recombination in the base.

On top of the BSF layer 108 a sequence of heavily doped p-type and n-type layers 109a and 109b is deposited that forms a tunnel diode, i.e. an ohmic circuit element that forms an electrical connection between subcell A to subcell B. Layer 109a is preferably composed of p++ AlGaAs, and layer 109b is preferably composed of n++ GaInP.

On top of the tunnel diode layers 109 a window layer 110 is deposited, preferably n+ GaInP. The advantage of utilizing GaInP as the material constituent of the window layer 110 is that it has an index of refraction that closely matches the adjacent emitter layer 111, as more fully described in U.S. patent application Ser. No. 12/258,190, filed Oct. 24, 2008. The window layer 110 used in the subcell B also operates to reduce the interface recombination loss. It should be apparent to one skilled in the art, that additional layer(s) may be added or deleted in the cell structure without departing from the scope of the present disclosure.

On top of the window layer 110 the layers of subcell B are deposited: the n-type emitter layer 111 and the p-type base layer 112. These layers are composed GaInP and InGaAs respectively, although any other suitable materials consistent with lattice constant and band gap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 111 and 112 according to the present disclosure will be discussed in conjunction with FIG. 18.

In some previously disclosed implementations of an inverted metamorphic solar cell, the middle cell was a homostructure. In some embodiments of the present disclosure, similarly to the structure disclosed in U.S. patent application Ser. No. 12/023,772, the middle subcell becomes a heterostructure with an GaInP emitter and its window is converted from AlInP to GaInP. This modification eliminated the refractive index discontinuity at the window/emitter interface of the middle subcell, as more fully described in U.S. patent application Ser. No. 12/258,190, filed Oct. 24, 2008. Moreover, the window layer 110 is preferably doped three times that of the emitter 111 to move the Fermi level up closer to the conduction band and therefore create band bending at the window/emitter interface which results in constraining the minority carriers to the emitter layer.

In one embodiment of the present disclosure, the middle subcell emitter has a band gap equal to the top subcell emitter, and the third subcell emitter has a band gap greater than the band gap of the base of the middle subcell. Therefore, after fabrication of the solar cell, and implementation and operation, neither the emitters of middle subcell B nor the third subcell C will be exposed to absorbable radiation. Substantially all of the photons representing absorbable radiation will be absorbed in the bases of cells B and C, which have narrower band gaps than the emitters. Therefore, the advantages of using heterojunction subcells are: (i) the short wavelength response for both subcells will improve, and (ii) the bulk of the radiation is more effectively absorbed and collected in the narrower band gap base. The effect will be to increase the short circuit current $J_{sc}$.

On top of the cell B is deposited a BSF layer 113 of AlInGaAs, which performs the same function as the BSF layer 109. The p++/n++ tunnel diode layers 114a and 114b respectively are deposited over the BSF layer 113, similar to the layers 109a and 109b, forming an ohmic circuit element to connect subcell B to subcell C. The layer 114a may be composed of p++ AlGaAs, and layer 114b may be composed of n++ GaAs or GaInP.

In some embodiments a barrier layer 115, composed of n-type (Al)GaInP, is deposited over the tunnel diode 114a/114b, to a thickness of about 0.5 micron. Such barrier layer is intended to prevent threading dislocations from propagating, either opposite to the direction of growth into the middle and top subcells B and C, or in the direction of growth into the bottom subcell A, and is more particularly described in copending U.S. patent application Ser. No. 11/860,183, filed Sep. 24, 2007.

A metamorphic layer (or graded interlayer) 116 is deposited over the barrier layer 115. Layer 116 is preferably a compositionally step-graded series of AlGaInAs layers, preferably with monotonically changing lattice constant, so as to achieve a gradual transition in lattice constant in the semiconductor structure from subcell B to subcell C while minimizing threading dislocations from occurring. In some embodiments, the band gap of layer 116 is constant throughout its thickness, preferably approximately equal to 1.51 eV, or otherwise consistent with a value slightly greater than the band gap of the middle subcell B. One embodiment of the graded interlayer may also be expressed as being composed of $(In_xGa_{1-x})_yAl_{1-y}As$, with x and y selected such that the band gap of the interlayer remains constant at approximately 1.51 eV or other appropriate band gap.

In an alternative embodiment where the solar cell has only two subcells, and the "middle" cell B is the uppermost or top subcell in the final solar cell, wherein the "top" subcell B would typically have a band gap of 1.8 to 1.9 eV, then the band gap of the interlayer would remain constant at 1.9 eV.

In the inverted metamorphic structure described in the Wanlass et al. paper cited above, the metamorphic layer consists of nine compositionally graded GaInP steps, with each step layer having a thickness of 0.25 micron. As a result, each layer of Wanlass et al. has a different band gap. In one embodiment of the present invention, the layer 116 is composed of a plurality of layers of AlGaInAs, with monotonically changing lattice constant, each layer having the same band gap, approximately 1.51 eV.

The advantage of utilizing a constant band gap material such as AlGaInAs is that arsenide-based semiconductor material is much easier to process from a manufacturing standpoint in standard commercial MOCVD reactors than materials incorporating phosphorus, while the small amount of aluminum in the band gap material assures radiation transparency of the metamorphic layers.

Although one embodiment of the present disclosure utilizes a plurality of layers of AlGaInAs for the metamorphic layer 116 for reasons of manufacturability and radiation transparency, other embodiments of the present disclosure may utilize different material systems to achieve a change in lattice constant from subcell B to subcell C. Other embodiments of the present disclosure may utilize continuously graded, as opposed to step graded, materials. More generally, the graded interlayer may be composed of any of the As, P, N, Sb based III-V compound semiconductors subject to the constraints of having the in-plane lattice parameter greater or equal to that of the second solar cell and less than or equal to that of the third solar cell, and having a band gap energy greater than that of the second solar cell.

In another embodiment of the present disclosure, an optional second barrier layer 117 may be deposited over the AlGaInAs metamorphic layer 116. The second barrier layer 117 will typically have a different composition than that of barrier layer 115, and performs essentially the same function of preventing threading dislocations from propagating. In one embodiment, barrier layer 117 is n+ type GaInP.

A window layer 118 preferably composed of n+ type GaInP is then deposited over the barrier layer 117 (or directly over layer 116, in the absence of a second barrier layer). This window layer operates to reduce the recombination loss in subcell "C". It should be apparent to one skilled in the art that additional layers may be added or deleted in the cell structure without departing from the scope of the present disclosure.

On top of the window layer 118, the layers of cell C are deposited: the n+ emitter layer 119, and the p-type base layer 120. These layers are preferably composed of n+ type GaInAs and p+ type GaInAs respectively, or n+ type GaInP and p type GaInAs for a heterojunction subcell, although other suitable materials consistent with lattice constant and band gap requirements may be used as well. The doping profile of layers 119 and 120 will be discussed in connection with FIG. 18.

A BSF layer 121, preferably composed of AlGaInAs, is then deposited on top of the cell C, the BSF layer performing the same function as the BSF layers 108 and 113.

The p++/n++ tunnel diode layers 122a and 122b respectively are deposited over the BSF layer 121, similar to the layers 114a and 114b, forming an ohmic circuit element to connect subcell C to subcell D. The layer 122a is composed of p++ AlGaInAs, and layer 122b is composed of n++ InGaAs, InGaP, InGaAsP, or other suitable material.

In some embodiments a barrier layer 123, preferably composed of n-type GaInP, is deposited over the tunnel diode 122a/122b, to a thickness of about 0.5 micron. Such barrier layer is intended to prevent threading dislocations from propagating, either opposite to the direction of growth into the top and middle subcells A, B and C, or in the direction of growth into the subcell D, and is more particularly described in copending U.S. patent application Ser. No. 11/860,183, filed Sep. 24, 2007.

A metamorphic layer (or graded interlayer) 124 is deposited over the barrier layer 123. Layer 124 is preferably a compositionally step-graded series of AlGaInAs layers, preferably with monotonically changing lattice constant, so as to achieve a gradual transition in lattice constant in the semiconductor structure from subcell C to subcell D while minimizing threading dislocations from occurring. In some embodiments the band gap of layer 124 is constant throughout its thickness, preferably approximately equal to 1.1 eV, or otherwise consistent with a value slightly greater than the band gap of the middle subcell C. One embodiment of the graded interlayer may also be expressed as being composed of $(In_xGa_{1-x})_yAl_{1-y}As$, with x and y selected such that the band gap of the interlayer remains constant at approximately 1.1 eV or other appropriate band gap.

A window layer 125 preferably composed of n+ type AlGaInAs is then deposited over layer 124 (or over a second barrier layer, if there is one, disposed over layer 124). This window layer operates to reduce the recombination loss in the fourth subcell "D". It should be apparent to one skilled in the art that additional layers may be added or deleted in the cell structure without departing from the scope of the present invention.

On top of the window layer 125, the layers of cell D are deposited: the n+ emitter layer 126, and the p-type base layer 127. These layers are preferably composed of n+ type GaInAs and p type GaInAs respectively, although other suitable materials consistent with lattice constant and band gap requirements may be used as well. The doping profile of layers 126 and 127 will be discussed in connection with FIG. 20.

A BSF layer 128, preferably composed of p+ type AlGaInAs, is then deposited on top of the cell D, the BSF layer performing the same function as the BSF layers 108, 113 and 121.

Finally a high band gap contact layer 129, preferably composed of p++ type AlGaInAs, is deposited on the BSF layer 128.

The composition of this contact layer 129 located at the bottom (non-illuminated) side of the lowest band gap photovoltaic cell (i.e., subcell "D" in the depicted embodiment) in a multijunction photovoltaic cell, can be formulated to reduce absorption of the light that passes through the cell, so that (i) the backside ohmic metal contact layer below it (on the non-illuminated side) will also act as a mirror layer, and (ii) the contact layer doesn't have to be selectively etched off, to prevent absorption.

It should be apparent to one skilled in the art, that additional layer(s) may be added or deleted in the cell structure without departing from the scope of the present invention.

FIG. 4 is a highly simplified cross-sectional view of the first and second solar cells of FIGS. 3A and 3B after deposition of a metallization layer 130 over the contact layer of the second solar cell, according to the present disclosure. The layer 130 is deposited over the p+ semiconductor contact layer 129. In some embodiments, the metal is the sequence of metal layers Ti/Au/Ag/Au.

The metal contact scheme chosen is one that has a planar interface with the semiconductor, after heat treatment to activate the ohmic contact. This is done so that (1) a dielectric layer separating the metal from the semiconductor doesn't have to be deposited and selectively etched in the metal contact areas; and (2) the contact layer is specularly reflective over the wavelength range of interest.

Figure 4A:
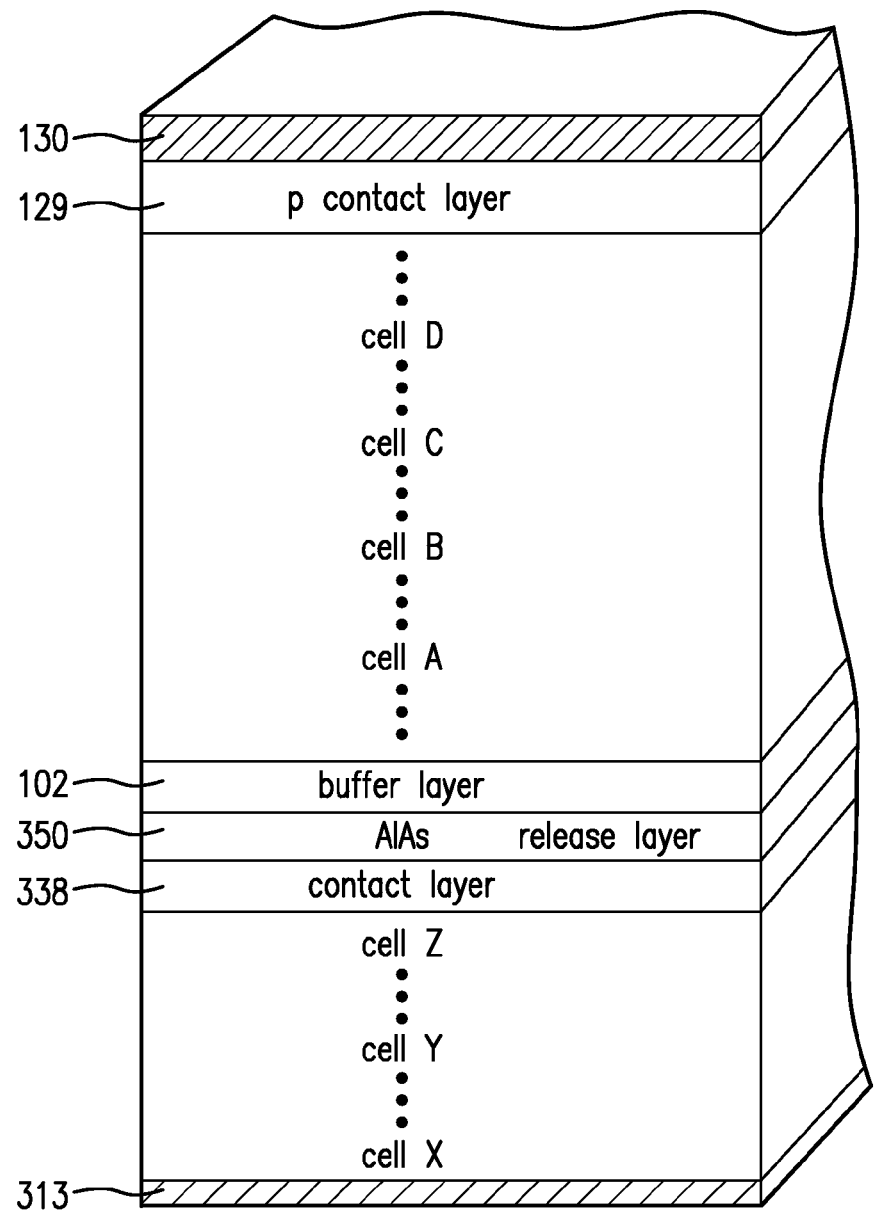
FIG. 4A is a highly simplified cross-sectional view of the first and second solar cells of FIGS. 3A and 3B after deposition of a metallization layer over the contact layer of the second solar cell, in a first embodiment according to the present disclosure.
Figure 4B:
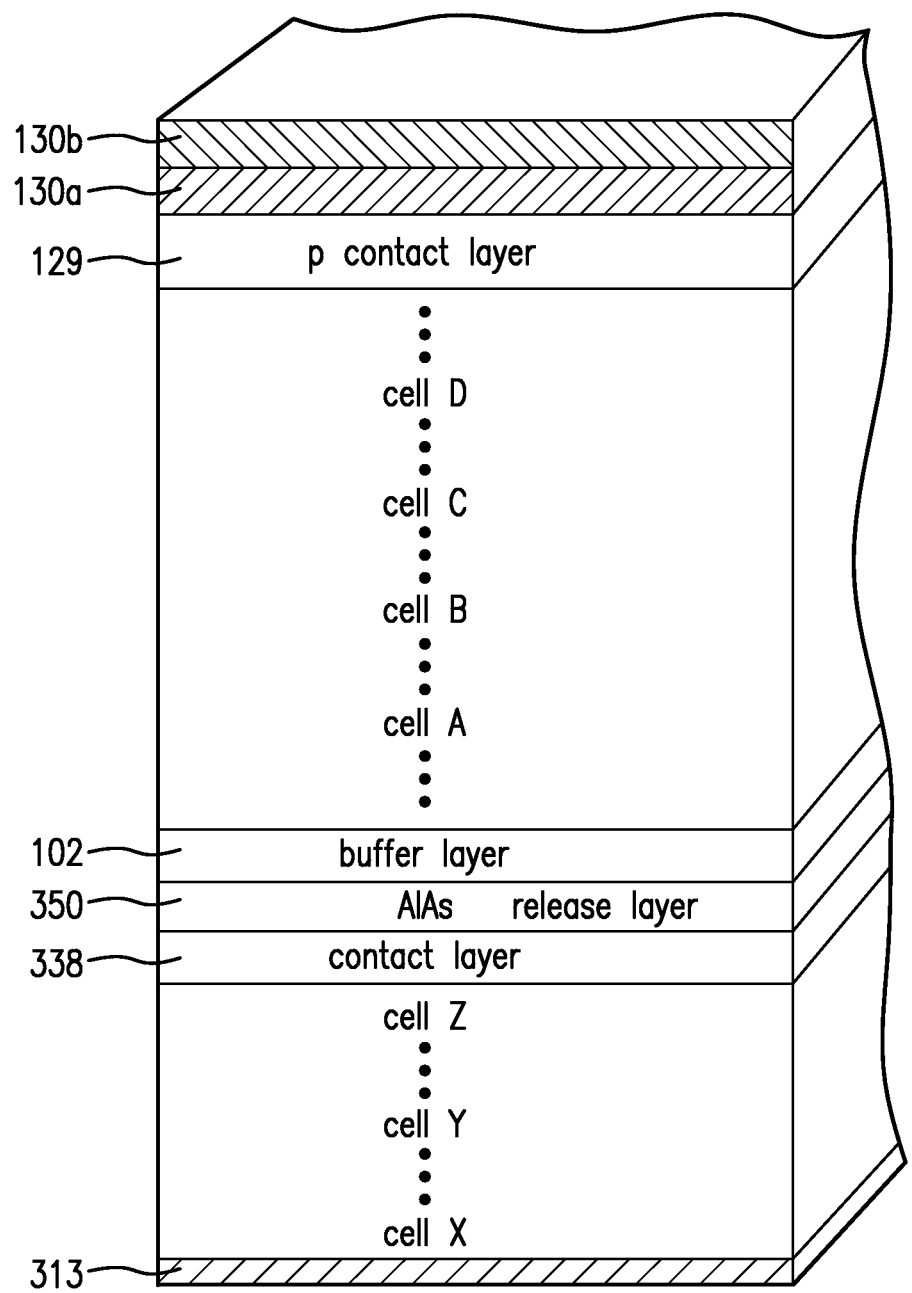
FIG. 4B is a highly simplified cross-sectional view of the first and second solar cells of FIGS. 3A and 3B after deposition of a metallization layer over the contact layer of the second solar cell, in a second embodiment according to the present disclosure.
Figure 5:
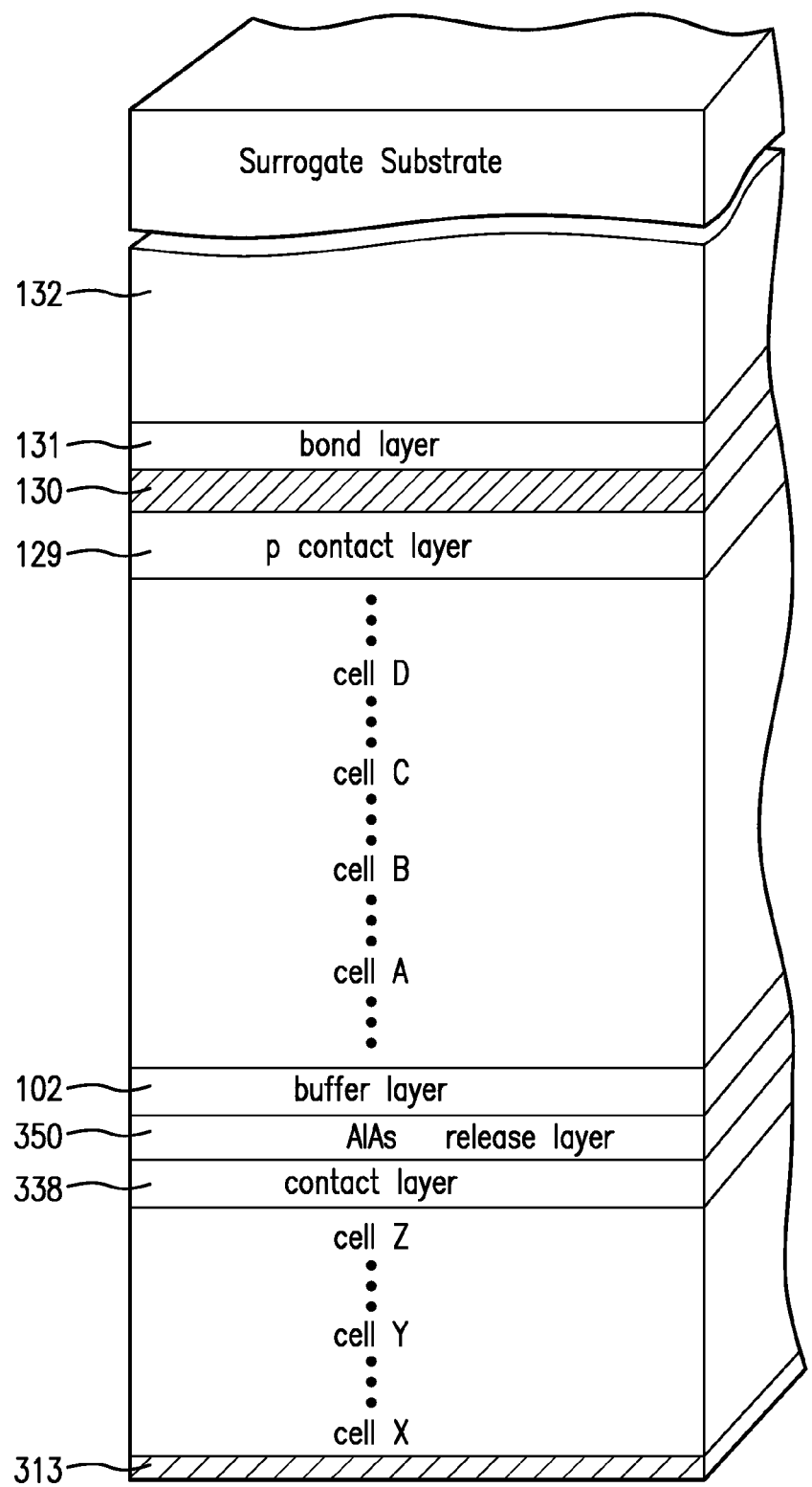
FIG. 5 is a cross-sectional view of the multijunction solar cells of FIG. 4 after attachment of a surrogate substrate over the metallization layer of the second solar cell, according to the present disclosure.

FIG. 5 is a cross-sectional view of the multijunction solar cell of either FIG. 4A or 4B (which we will refer to simply as FIG. 4) after attachment of a surrogate substrate over the metallization layer 130 of the second solar cell, according to the present disclosure. An adhesive layer 131 is deposited over the metal layer 130. The adhesive may be CR 200 (manufactured by Brewer Science, Inc. of Rolla, Mo.).

In the next process step, a surrogate substrate 132, preferably sapphire, is attached. Alternatively, the surrogate substrate may be glass, GaAs, Ge or Si, or other suitable material. The surrogate substrate is about 40 mils in thickness, and is perforated with holes about 1 mm in diameter, spaced 4 mm apart, to aid in subsequent removal of the adhesive and the substrate. Of course, surrogate substrates with other thicknesses and perforation configurations may be used as well. As an alternative to using an adhesive layer 131, a suitable substrate (e.g., GaAs) may be eutectically or permanently bonded to the metal layer 130.

Figure 6:
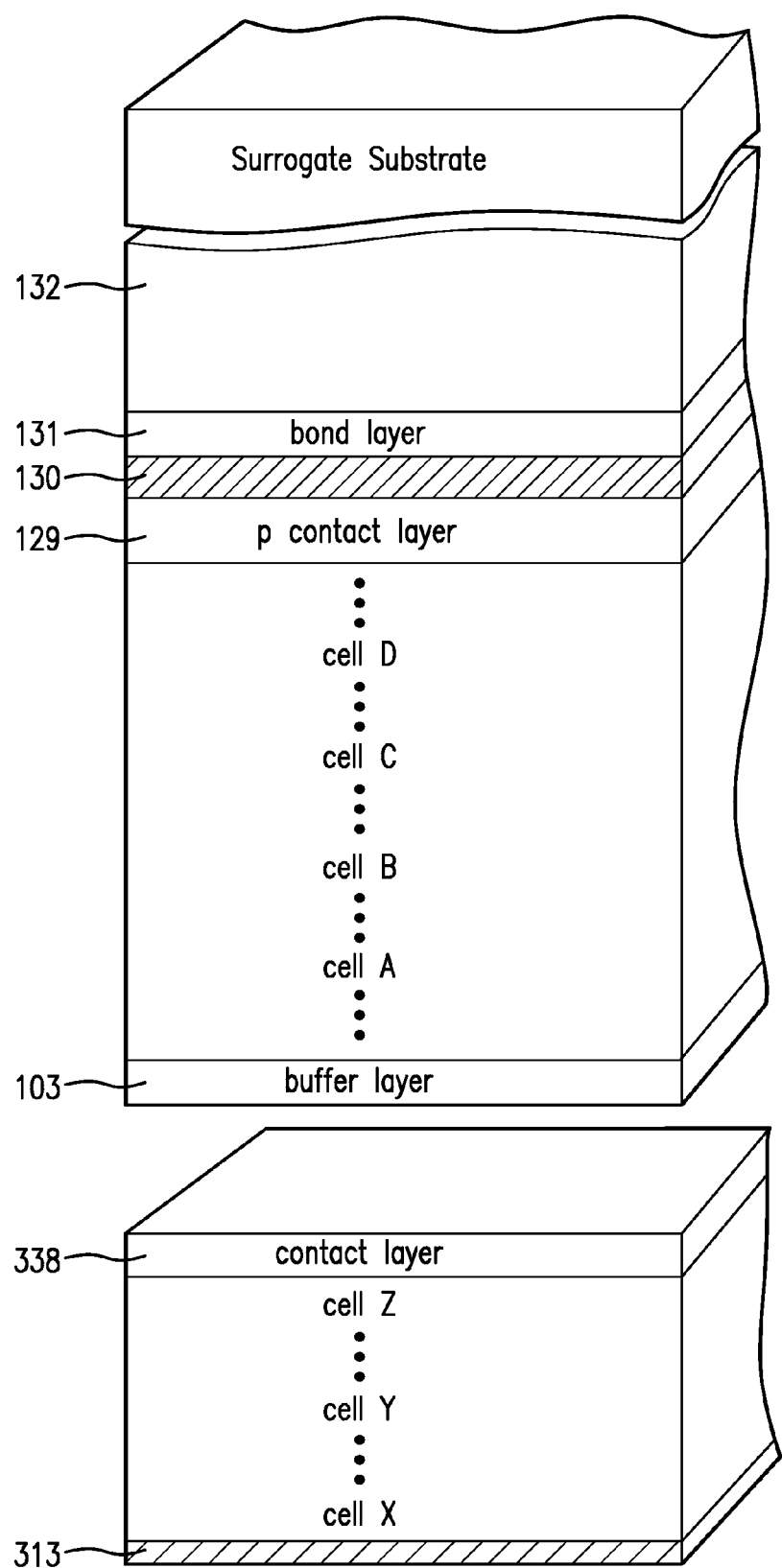
FIG. 6 is a cross-sectional view of the first and second solar cells of FIG. 4B after etching the release layer and separating the first and second solar cells.

FIG. 6 is a cross-sectional view of the first and second solar cells of FIG. 4B after etching the release layer 350 and separating the first and second solar cells. The etching may be done by wet etch (aqueous HF or hydrofloric acid) or a gas etch (anhydrous HF or hydrogen fluoride), or any other suitable technique.

Figure 7A:
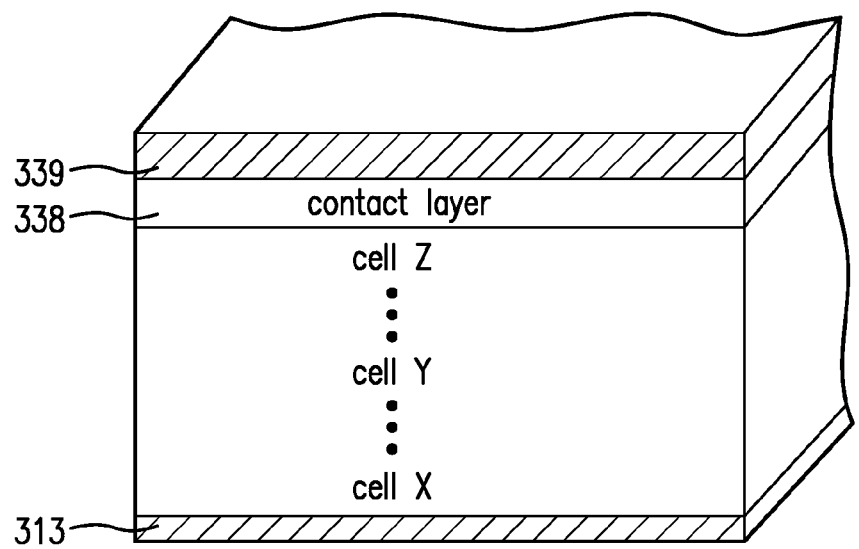
FIG. 7A is a cross-sectional view of the first solar cell of FIG. 6 after deposition of a metallization layer over the contact layer of the first solar cell, according to the present disclosure.

FIG. 7A is a cross-sectional view of the first solar cell of FIG. 6 after deposition of a metallization layer 339 over the contact layer 338 of the first solar cell, according to the present disclosure.

Figure 7B:
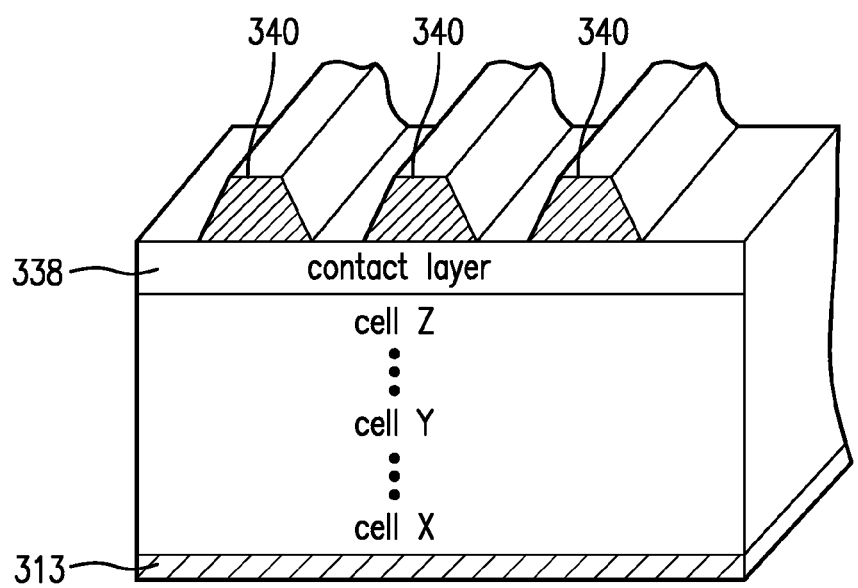
FIG. 7B is a cross-sectional view of the first solar cell of FIG. 7A after lithographic processing of the metallization layer of the first solar cell to form grid lines, according to the present disclosure.

FIG. 7B is a cross-sectional view of the first solar cell of FIG. 7A after lithographic processing of the metallization layer of the first solar cell to form grid lines, according to the present disclosure. After the metallization layer 339 is deposited, the grid lines 340 are formed. The grid lines 340 (as well as bus lines and contact pads, not shown) are lithographically patterned using known masking and lithographic techniques. The mask is subsequently lifted off to form the finished metal grid lines 340 as depicted in the Figure. In subsequent processing, the portion of the cap layer that has not been metallized is removed, exposing the surface of the window layer 336. In some embodiments, a trench or channel (not shown), or portion of the semiconductor structure, is also etched around each of the solar cells. These channels define a peripheral boundary between the solar cell (later to be scribed from the wafer) and the rest of the wafer, and leaves a mesa structure (or a plurality of mesas, in the case of more than one solar cell per wafer) which define and constitute the solar cells later to be scribed and diced from the wafer.

Figure 8:
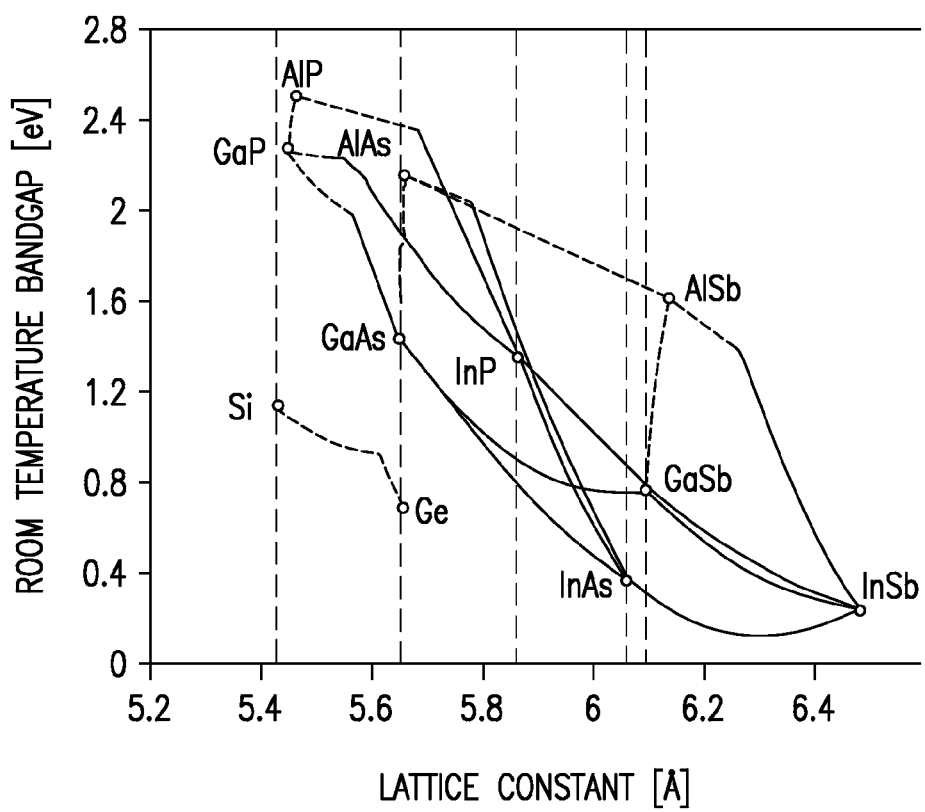
FIG. 8 is a graph representing the band gap of certain binary materials and their lattice constants.

FIG. 8 is a graph representing the band gap of certain binary materials and their lattice constants. The band gap and lattice constants of ternary materials are located on the lines drawn between typical associated binary materials (such as the ternary material AlGaAs being located between the GaAs and AlAs points on the graph, with the band gap of the ternary material lying between 1.42 eV for GaAs and 2.16 eV for AlAs depending upon the relative amount of the individual constituents). Thus, depending upon the desired band gap, the material constituents of ternary materials can be appropriately selected for growth.

Figure 9:
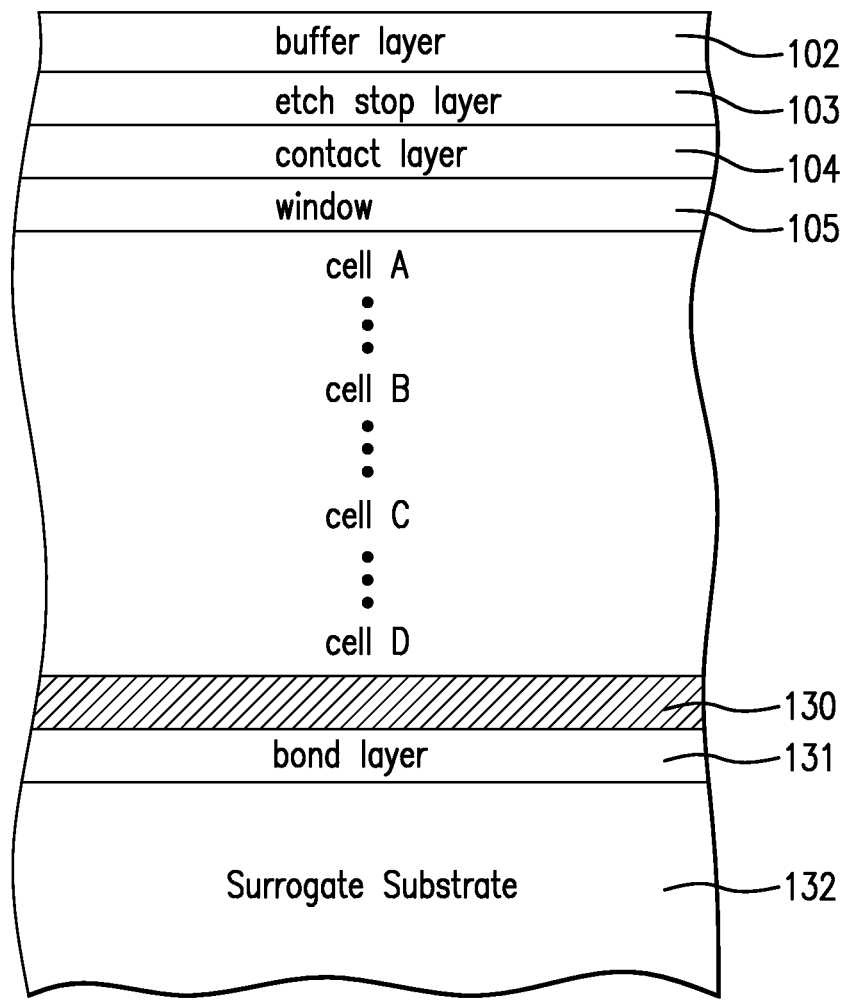
FIG. 9 is a cross-sectional view of the second solar cell of FIG. 6, in some embodiments, according to the present disclosure, oriented and depicted with the surrogate substrate at the bottom of the figure.

FIG. 9 is a another cross-sectional view of the solar cell of FIG. 8, but here oriented and depicted with the surrogate substrate 132 at the bottom of the figure. Subsequent Figures in this application will assume such orientation.

Figure 10:
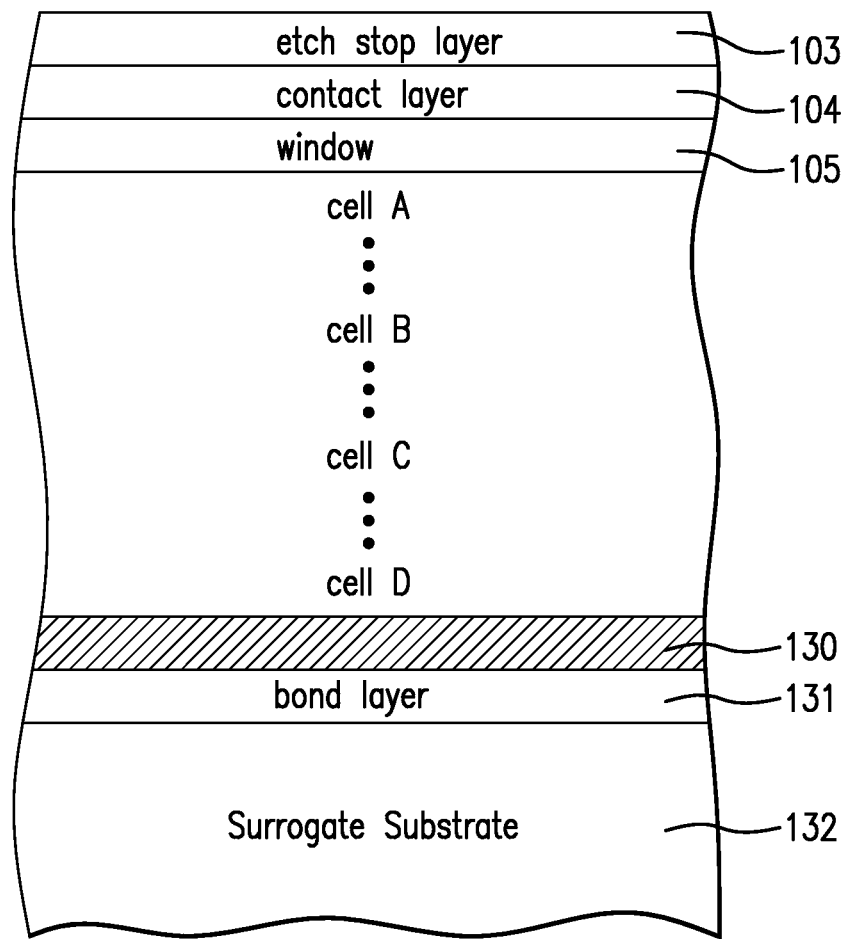
FIG. 10 is a cross-sectional view of the solar cell of FIG. 9 after the next sequence of process steps including removal of the buffer layer.

FIG. 10 is a cross-sectional view of the solar cell of FIG. 9 after the next process step in which the buffer layer 102, and the etch stop layer 103 is removed by a HCl/H$_2$O solution.

FIG. 10 is a cross-sectional view of the solar cell of FIG. 9 after the next process step in which the buffer layer 102, and the etch stop layer 103 is removed by a HCl/H$_2$O solution.

Figure 12:
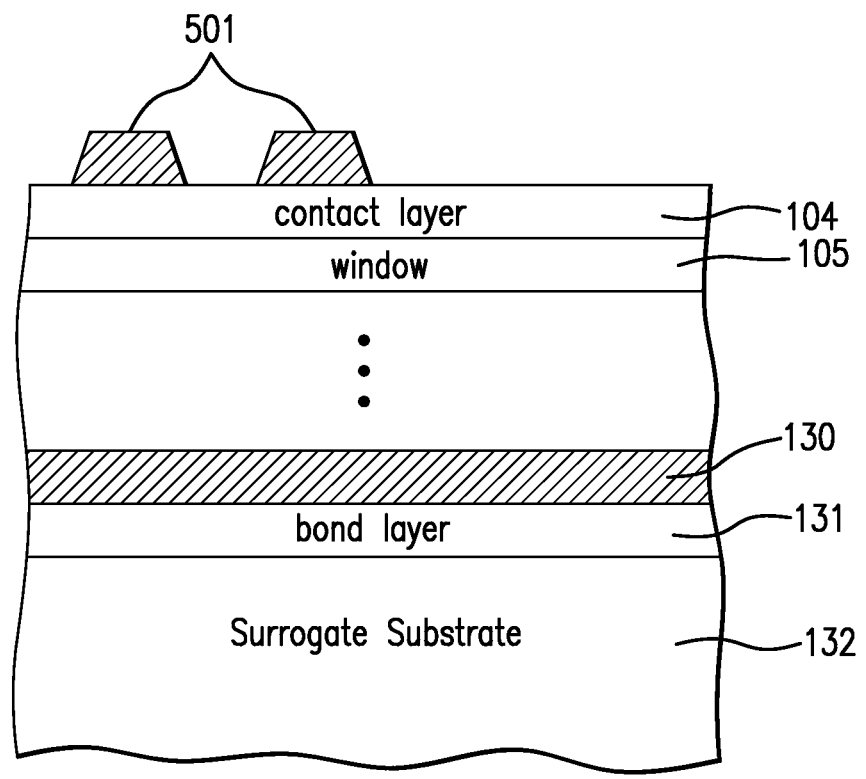
FIG. 12 is a cross-sectional view of the solar cell of FIG. 11 after the next sequence of process steps.

FIG. 12 is a cross-sectional view of the solar cell of FIG. 10 after the next sequence of process steps in which a photoresist mask (not shown) is placed over the contact layer 104 to form the grid lines 601. A photoresist layer is deposited over the contact layer 104, and lithographically patterned with the desired grid pattern. A metal layer is then deposited over the patterned photoresist by evaporation. The photoresist mask is then subsequently lifted off, leaving the finished metal grid lines 601 as depicted in the Figures.

As more fully described in U.S. patent application Ser. No. 12/218,582 filed Jul. 18, 2008, hereby incorporated by reference, the grid lines 601 are composed of a sequence of layers Pd/Ge/Ti/Pd/Au, although other suitable materials and layered sequences may be used as well.

Figure 11:
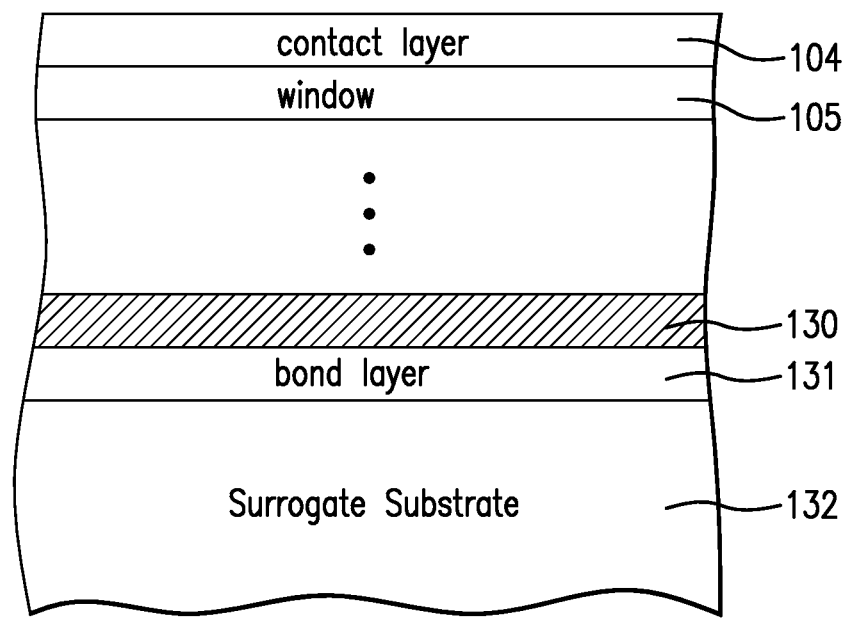
FIG. 11 is a cross-sectional view of the solar cell of FIG. 10 after the next sequence of process steps including removal of the etch stop layer.

FIG. 12 is a cross-sectional view of the solar cell of FIG. 11 after the next process step in which the grid lines are used as a mask to etch down the surface to the window layer 105 using a citric acid/peroxide etching mixture.

Figure 13:
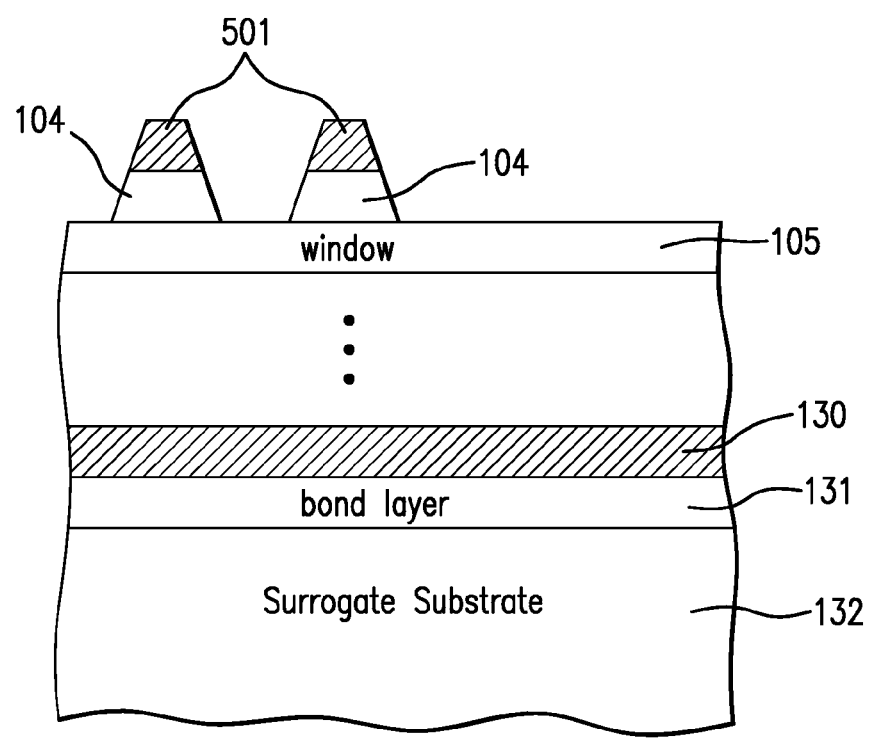
FIG. 13 is a cross-sectional view of the solar cell of FIG. 12 after the next sequence of process steps.
Figure 14:
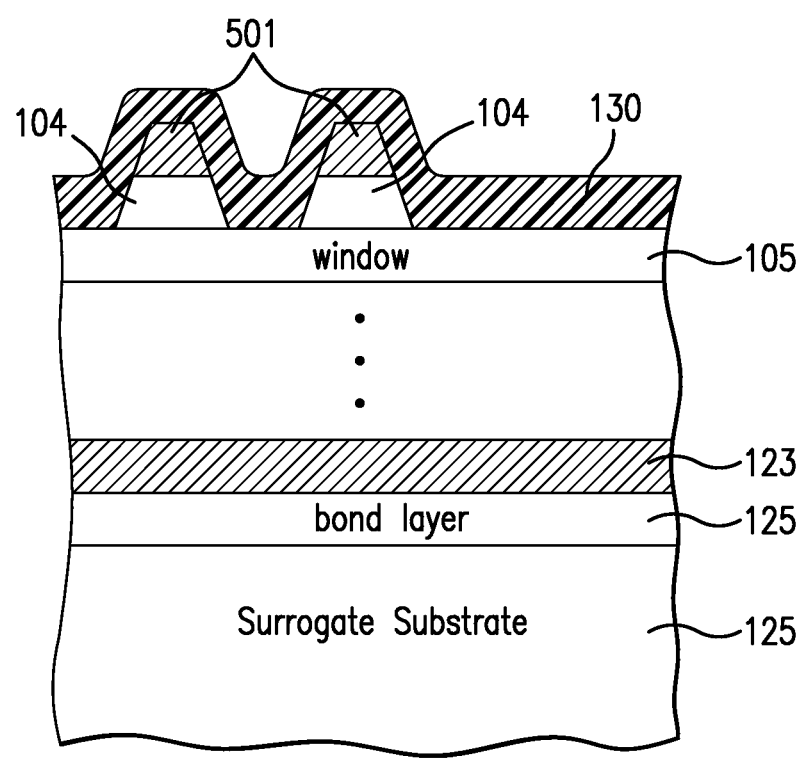
FIG. 14 is a cross-sectional view of the solar cell of FIG. 14 after the next sequence of process steps.

FIG. 14 is a cross-sectional view of the solar cell of FIG. 13 after the next process step in an embodiment of the present disclosure in which an antireflective (ARC) dielectric coating layer 130 is applied over the entire surface of the "top" side of the wafer over the grid lines 501.

Figure 15:
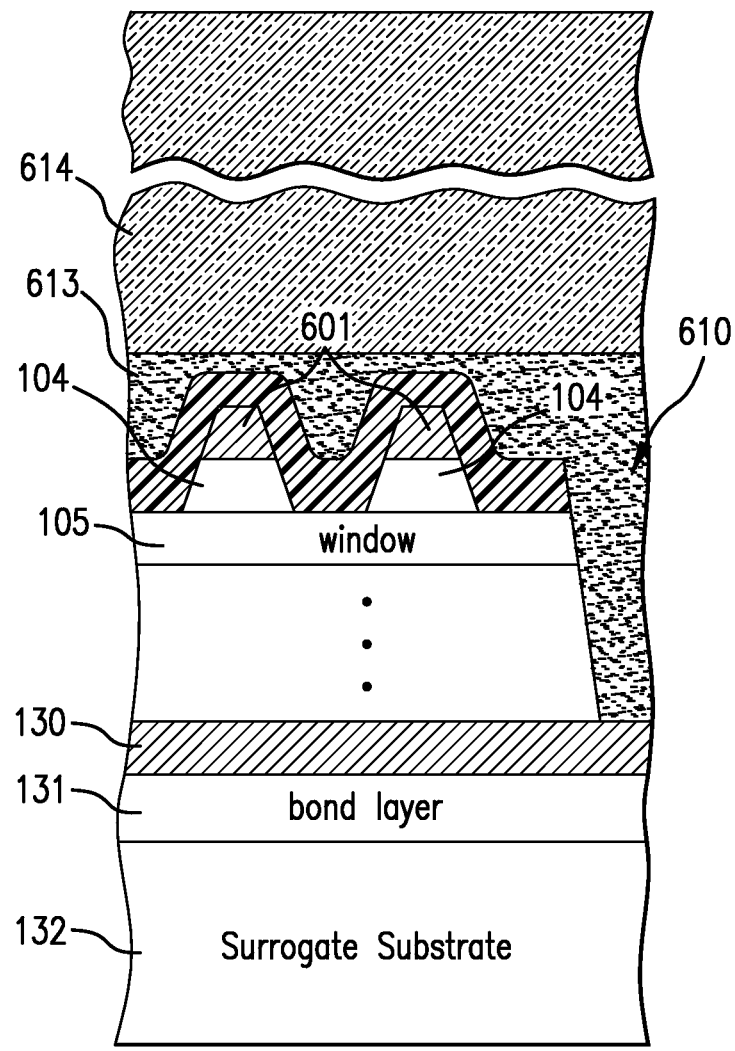
FIG. 15 is a cross-sectional view of the solar cell of FIG. 14 after the next sequence of process steps in one embodiment of the present disclosure.

FIG. 15 depicts a cover glass 614 is secured to the top of the cell by an adhesive 613. The cover glass 614 preferably covers the entire channel 610, but does not extend to the periphery of the cell near the channel 611. Although the use of a cover glass is one embodiment, it is not necessary for all implementations, and additional layers or structures may also be utilized for providing additional support or environmental protection to the solar cell.

Figure 16:
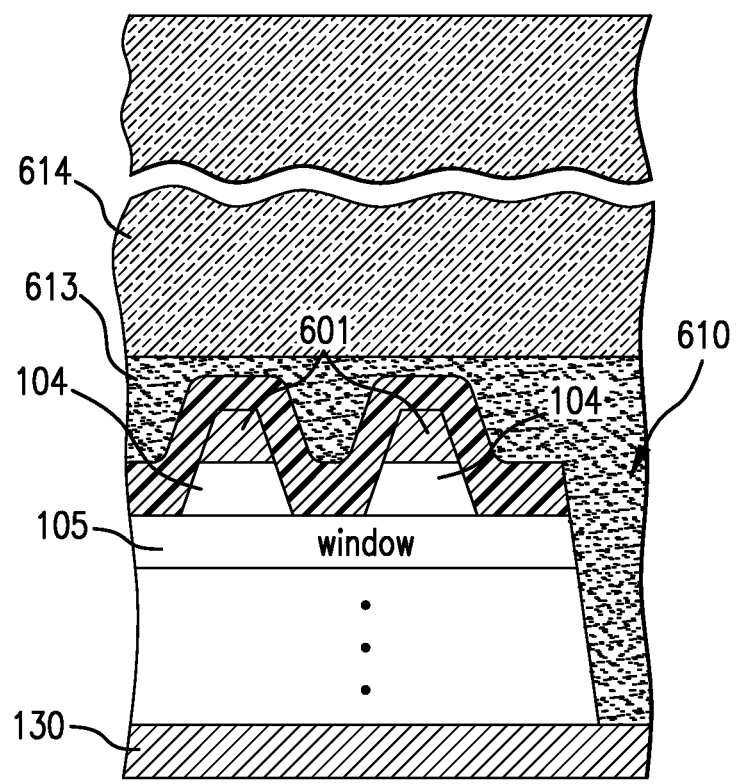
FIG. 16 is a cross-sectional view of the solar cell of FIG. 15 after the next process step in an embodiment of the present invention in which a cover glass in employed but the surrogate substrate is removed.

FIG. 16 is a cross-sectional view of the solar cell of FIG. 13 after the next process step of the present disclosure in an embodiment in which the bond layer 131, the surrogate substrate 132 and the peripheral portion 612 of the wafer is entirely removed, breaking off in the region of the channel 610, leaving only the solar cell with the cover glass 614 (or other supporting layers or structures) on the top, and the metal contact layer 130 on the bottom. The metal contact layer 130 forms the backside contact of the solar cell. The surrogate substrate is removed by the use of the Wafer Bond solvent, or other techniques. As noted above, the surrogate substrate includes perforations over its surface that allow the flow of solvent through the surrogate substrate 132 to permit its lift off. The surrogate substrate may be reused in subsequent wafer processing operations.

Figure 17A:
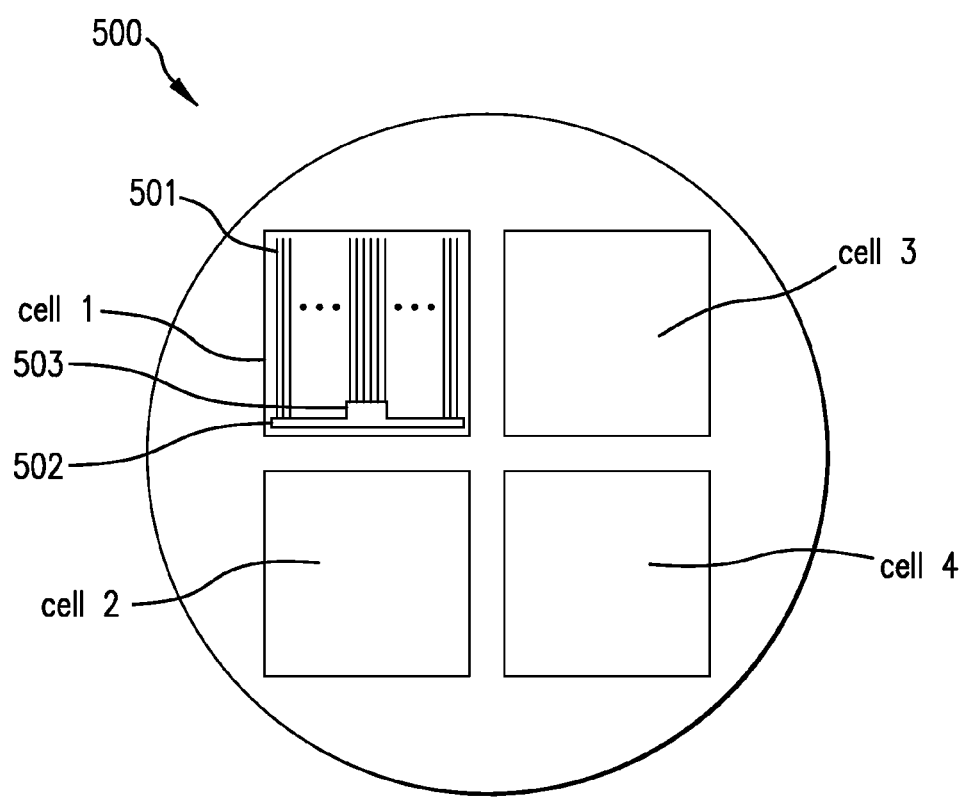
FIG. 17A is a top plan view of the wafer of FIG. 15 with four solar cells being implemented.

FIG. 17A is a top plan view of a wafer 500 according to the present disclosure in which four solar cells are implemented. The depiction of four cells is for illustration purposes only, and the present disclosure is not limited to any specific number of cells per wafer.

In each cell there are grid lines 601 (more particularly shown in cross-section in FIG. 12), an interconnecting bus line 602, and a contact pad 603. The geometry and number of grid and bus lines and the contact pad are illustrative and the present disclosure is not limited to the illustrated embodiment.

Figure 17B:
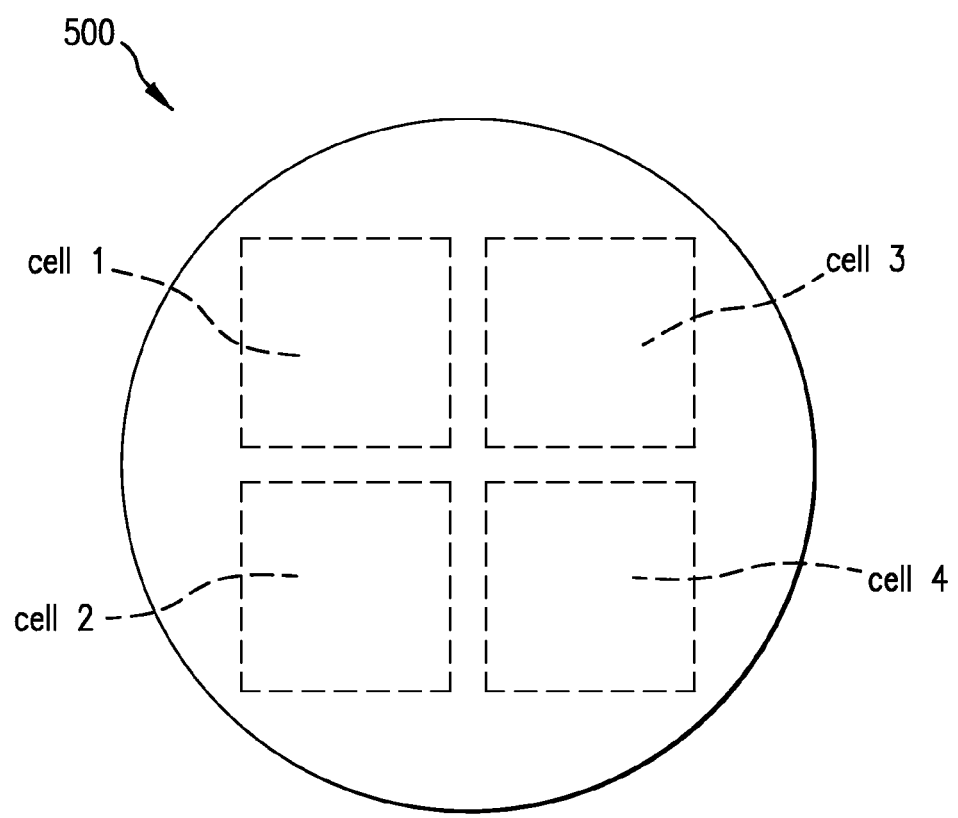
FIG. 17B is a bottom plan view of a wafer in the embodiment of FIG. 17A.

FIG. 17B is a bottom plan view of the wafer according to the present disclosure with four solar cells shown in FIG. 17A.

Figure 17C:
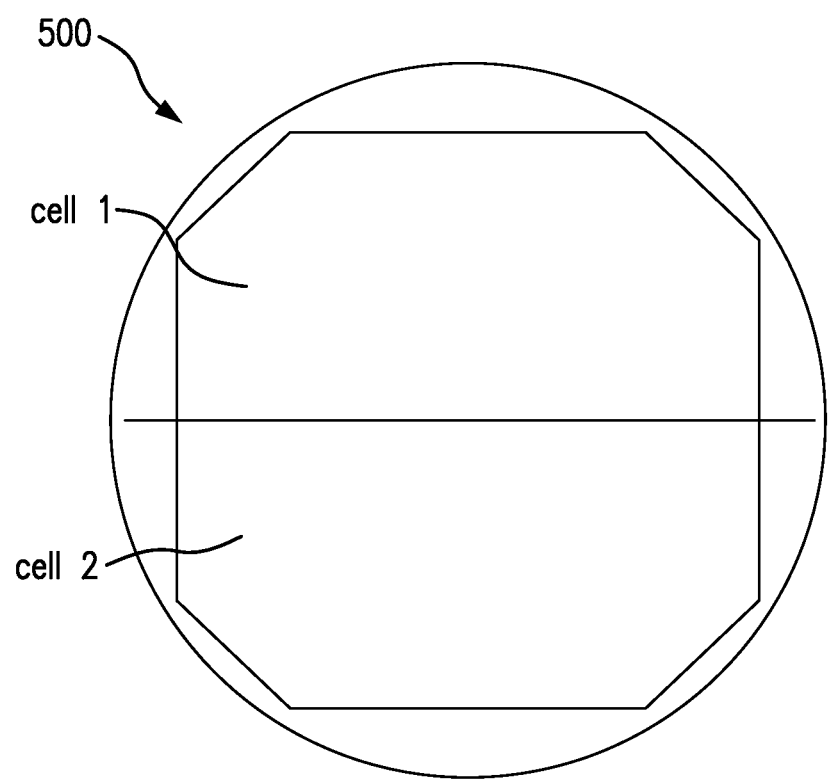
FIG. 17C is a top plan view of the wafer of FIG. 15 with two solar cells being implemented.

FIG. 17C is a top plan view of a wafer according to the present disclosure with two solar cells are implemented. The depiction of two cells is for illustration purposes only.

Figure 18:
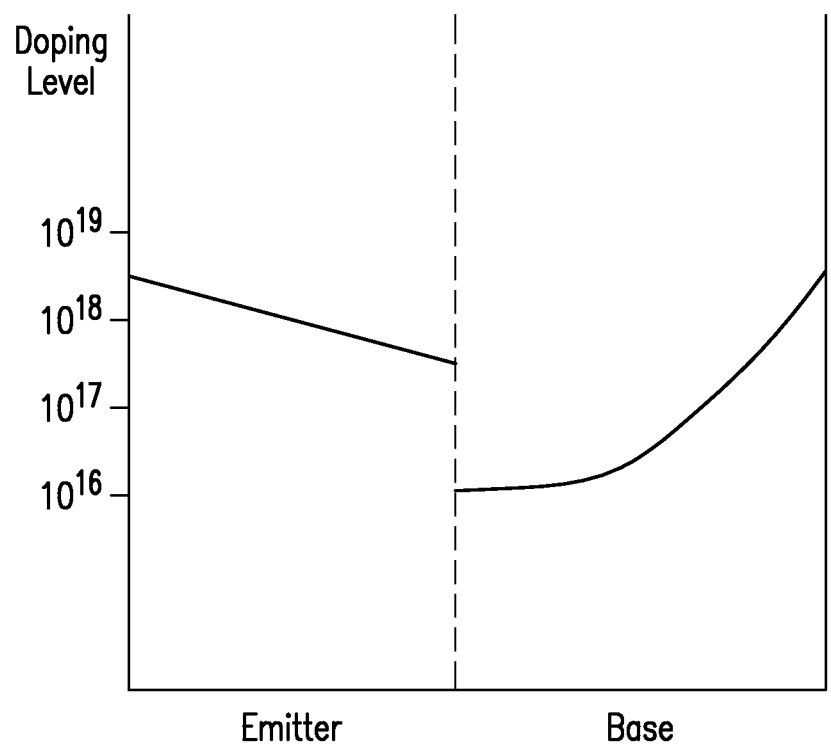
FIG. 18 is a graph of the doping profile in the base and emitter layers of a subcell in the inverted metamorphic solar cell according to the present disclosure.

FIG. 18 is a graph of a doping profile in the emitter and base layers in the top subcell "A" of the inverted metamorphic multijunction solar cell of the present disclosure. As noted in the description of FIG. 3A, the emitter of the upper first solar subcell is composed of a first region 206a in which the doping is graded from 3×10$^{18}$ to 1×10$^{18}$ free carriers per cubic centimeter, and a second region 206b directly disposed over the first region in which the doping is constant at 1×10$^{17}$ free carriers per cubic centimeter. Adjacent to the second region 206b is the first surface of a spacer region 206c, and adjacent to the second surface of the spacer region is the base layer 108a.

The specific doping profiles depicted herein (e.g., a linear profile) are merely illustrative, and other more complex profiles may be utilized as would be apparent to those skilled in the art without departing from the scope of the present disclosure.

Figure 19:
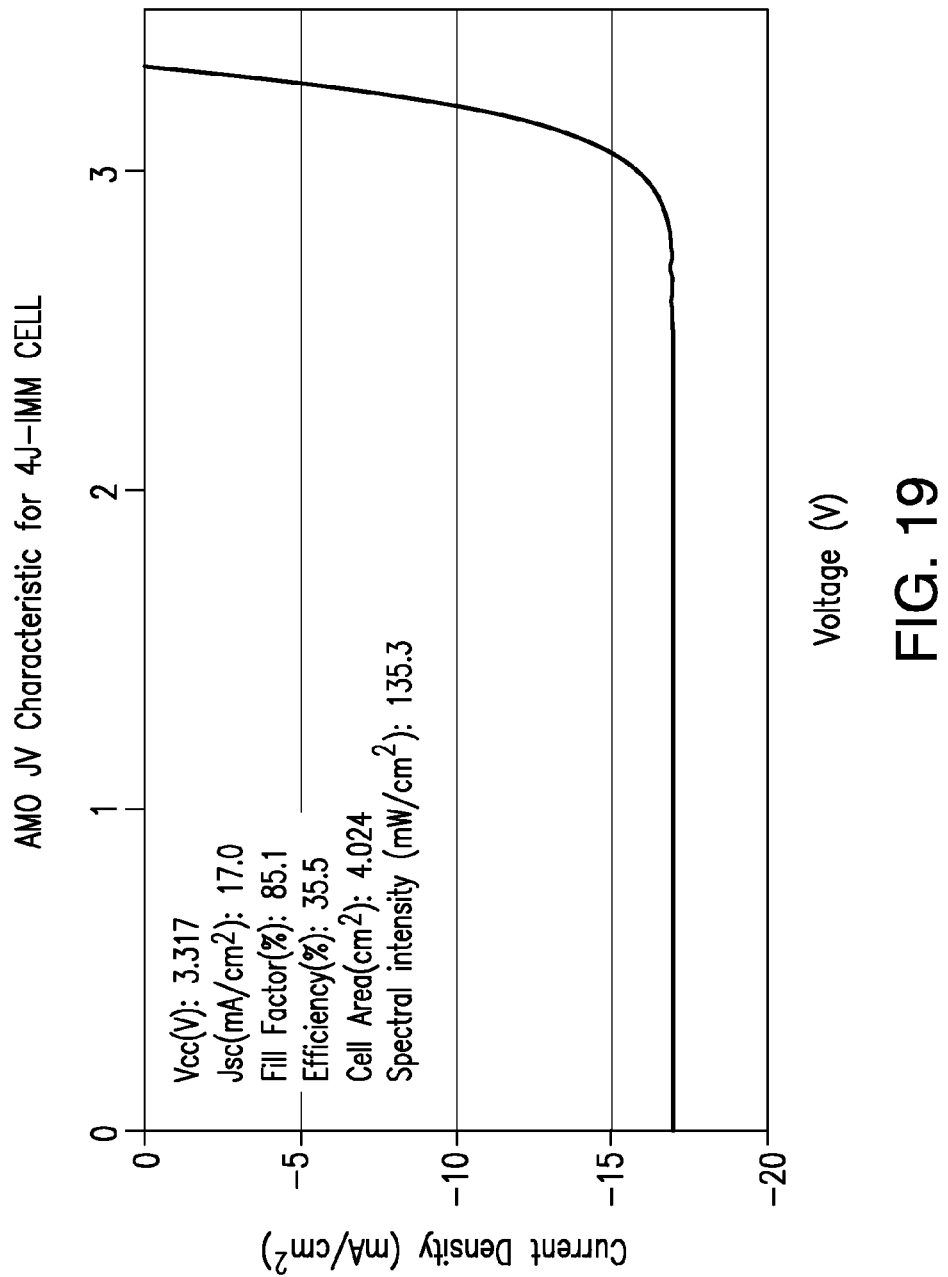
FIG. 19 is a graph that depicts the current density and voltage characteristics of an inverted metamorphic multijunction solar cell according to the present disclosure.

FIG. 19 is a graph that depicts the current density and voltage characteristics of one of the test solar cells fabricated according to the present invention. In this test cell, the lower fourth subcell had a band gap in the range of approximately 0.6 to 0.8 eV, the third subcell had a band gap in the range of approximately 0.9 to 1.1 eV, the second subcell had a band gap in the range of approximately 1.35 to 1.45 eV and the upper subcell had a band gap in the range of 1.8 to 2.1 eV. The solar cell was measured to have an open circuit voltage ($V_{oc}$) of approximately 3.317 volts, a short circuit current density of approximately 17.0 mA/cm², a fill factor of approximately 85.1%, and an AM0 efficiency of 35.5%.

Figure 20:
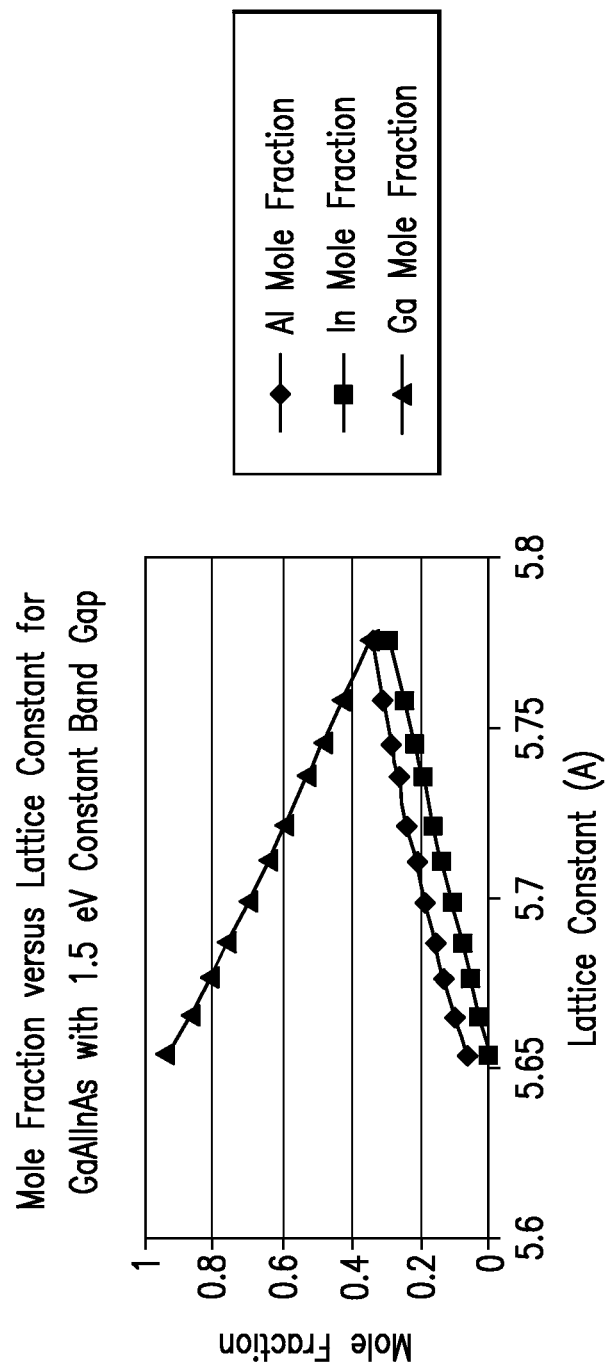
FIG. 20 is a graph representing the Al, Ga and In mole fractions versus the lattice constant in a AlGaInAs material system that is necessary to achieve a constant 1.51 eV band gap.

FIG. 20 is a diagram representing the range of band gaps of various GaInAlAs materials as a function of the relative concentration of Al, In, and Ga. This diagram illustrates how the selection of a constant band gap sequence of layers of GaInAlAs used in the metamorphic layer may be designed through the appropriate selection of the relative concentration of Al, In, and Ga to meet the different lattice constant requirements for each successive layer. Thus, whether 1.51 eV or 1.1 eV or other band gap value is the desired constant band gap, the diagram illustrates a continuous curve for each band gap, representing the incremental changes in constituent proportions as the lattice constant changes, in order for the layer to have the required band gap and lattice constant.

Figure 21:
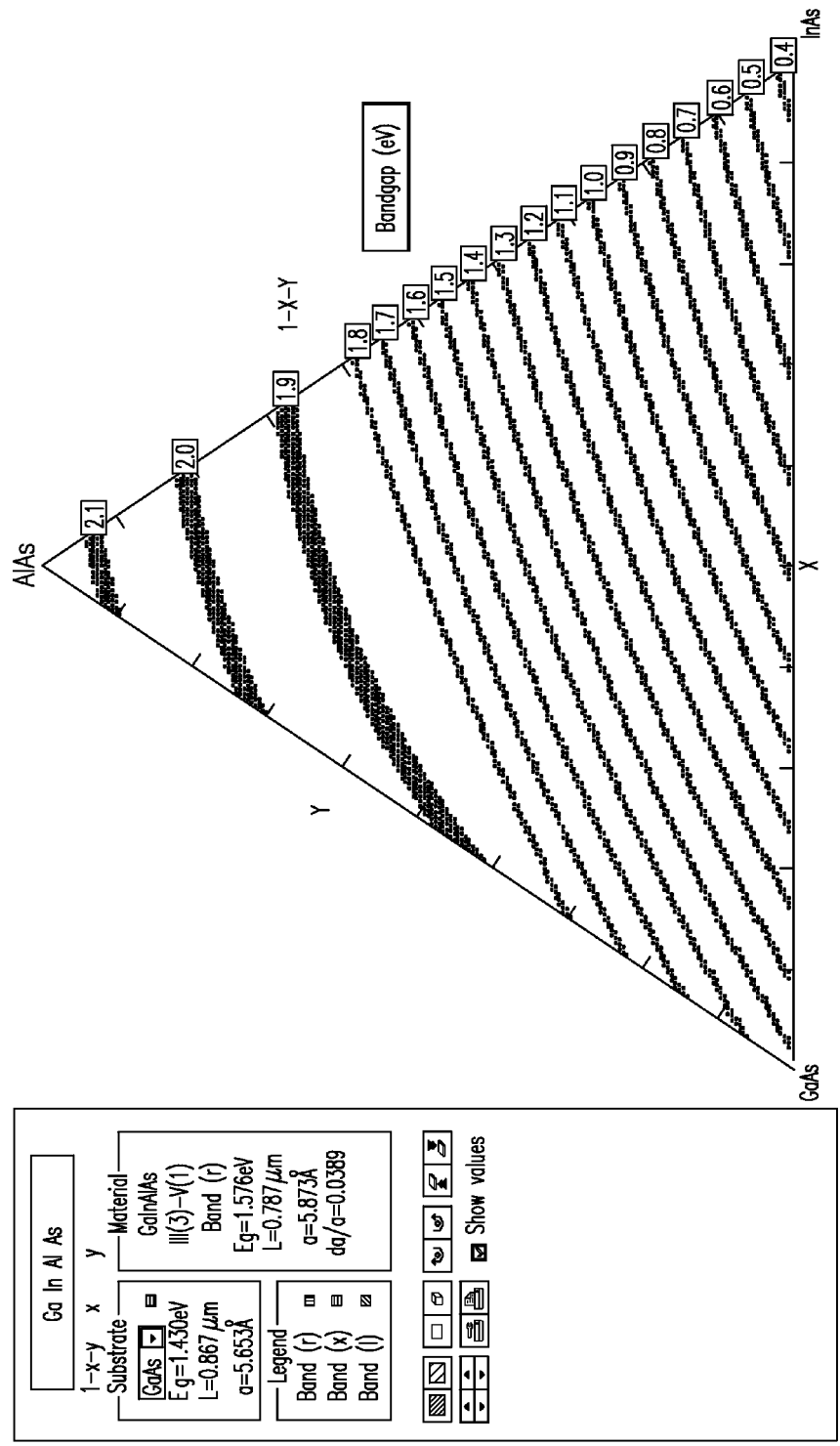
FIG. 21 is a diagram representing the relative concentration of Al, In, and Ga in an AlGaInAs material system needed to have a constant band gap with various designated values (ranging from 0.4 eV to 2.1 eV) as represented by curves on the diagram.

FIG. 21 is a graph that further illustrates the selection of a constant band gap sequence of layers of GaInAlAs used in the metamorphic layer by representing the Ga mole fraction versus the Al to In mole fraction in GaInAlAs materials that is necessary to achieve a constant 1.51 eV band gap.

Figure 22:
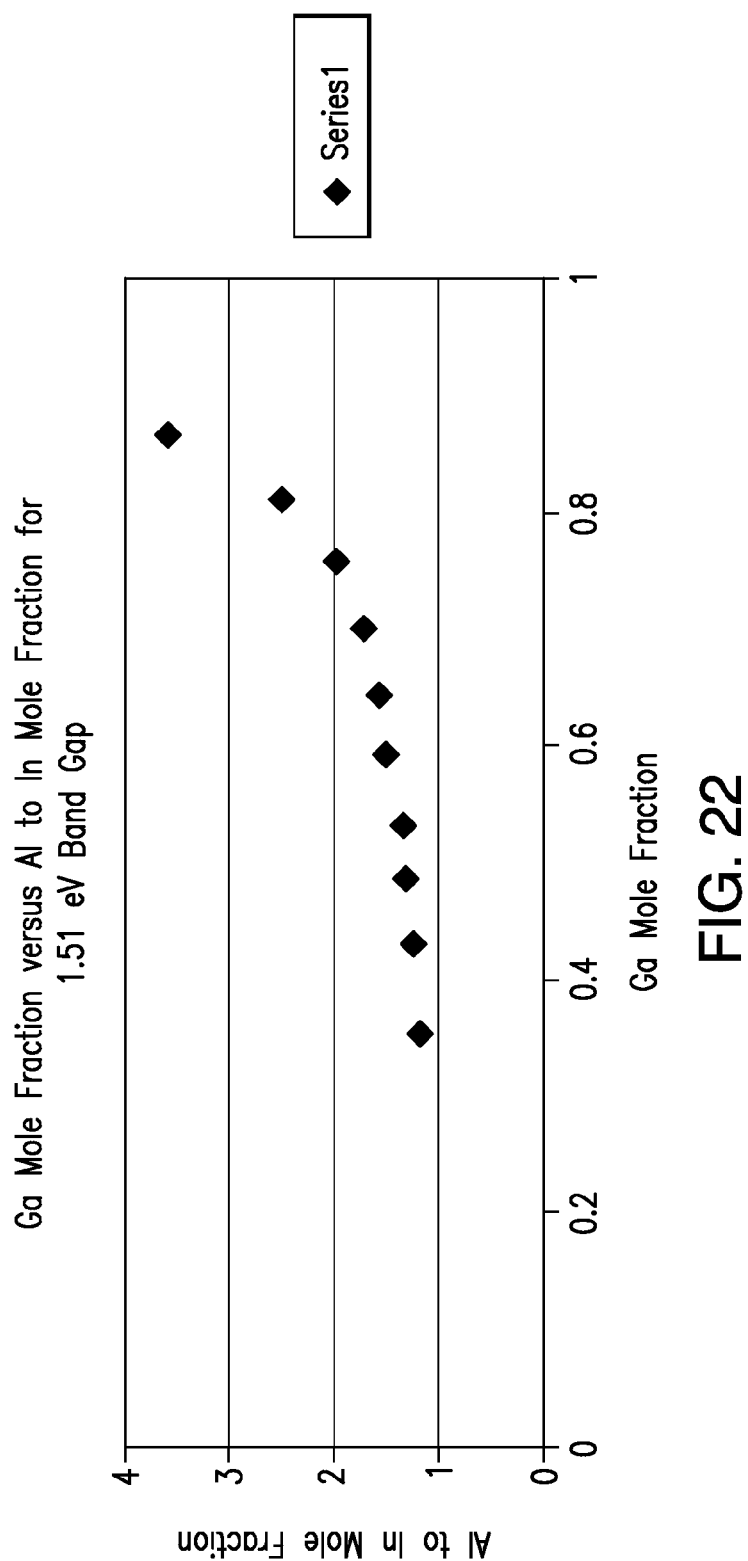
FIG. 22 is a graph representing the Ga mole fraction to the Al to In mole fraction in a AlGaInAs material system that is necessary to achieve a constant 1.51 eV band gap.

FIG. 22 is a graph that further illustrates the selection of a constant band gap sequence of layers of GaInAlAs used in the metamorphic layer by representing the mole fraction versus lattice constant in GaInAlAs materials that is necessary to achieve a constant 1.51 eV band gap band gap.

It will be understood that each of the elements described above, or two or more together, also may find a useful application in other types of structures or constructions differing from the types of structures or constructions described above.

Although described embodiments of the present disclosure utilizes a vertical stack of three subcells for the first solar cell, and four subcells for the second solar cell, various aspects and features of the present disclosure can apply to stacks with fewer or greater number of subcells, i.e. two junction cells, four junction cells, five, six, seven junction cells, etc. In the case of seven or more junction cells, the use of more than two metamorphic grading interlayer may also be utilized.

In addition, although the disclosed embodiments are configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the solar cell described in the present disclosure may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell 309, with p-type and n-type InGaP is one example of a homojunction subcell.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, GaInNAsSb, GaInNiAsBi, GaInAsBi, AlGaInNAs, ZnSSe, CdSSe, and similar materials, and still fall within the spirit of the present invention.

While the solar cell described in the present disclosure has been illustrated and described as embodied in a conventional multijunction solar cell, it is not intended to be limited to the details shown, since it is also applicable to inverted metamorphic solar cells, and various modifications and structural changes may be made without departing in any way from the spirit of the present invention.

Thus, while the description of the semiconductor device described in the present disclosure has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the foregoing others can, by applying current knowledge, readily adapt the present invention for various applications. Such adaptations should and are intended to be comprehended within the meaning and range of equivalence of the following claims.

It will be understood that each of the elements described above, or two or more together, also may find a useful application in other types of structures or constructions differing from the types of structures or constructions described above.

Although described embodiments of the present disclosure utilizes a vertical stack of four subcells, various aspects and features of the present disclosure can apply to stacks with fewer or greater number of subcells, i.e. two junction cells, three junction cells, five, six, seven junction cells, etc. In the case of seven or more junction cells, the use of more than two metamorphic grading interlayer may also be utilized.

In addition, although the disclosed embodiments are configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the solar cell described in the present disclosure may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n-type GaInP is one example of a homojunction subcell. Alternatively, as more particularly described in U.S. patent application Ser. No. 12/023,772 filed Jan. 31, 2008, the solar cell of the present disclosure may utilize one or more, or all, heterojunction cells or subcells, i.e., a cell or subcell in which the p-n junction is formed between a p-type semiconductor and an n-type semiconductor having different chemical compositions of the semiconductor material in the n-type regions, and/or different band gap energies in the p-type regions, in addition to utilizing different dopant species and type in the p-type and n-type regions that form the p-n junction.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, GaInNAsSb, GaInNiAsBi, GaInAsBi, AlGaInNAs, ZnSSe, CdSSe, and similar materials, and still fall within the spirit of the present invention.

While the solar cell described in the present disclosure has been illustrated and described as embodied in a conventional multijunction solar cell, it is not intended to be limited to the details shown, since it is also applicable to inverted metamorphic solar cells, and various modifications and structural changes may be made without departing in any way from the spirit of the present invention.

Thus, while the description of the semiconductor device described in the present disclosure has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the foregoing others can, by applying current knowledge, readily adapt the present invention for various applications. Such adaptations should and are intended to be comprehended within the meaning and range of equivalence of the following claims.

The invention claimed is:

1. A method of fabricating both a multijunction solar cell and an inverted metamorphic multijunction solar cell in a single process using a MOCVD reactor comprising:
   providing a semiconductor substrate;
   forming a first multijunction solar cell on said semiconductor substrate;
   forming a release layer over the first solar cell;
   forming an inverted metamorphic second solar cell including: (i) growing a first solar subcell having a first band gap on said release layer; (ii) growing a second solar subcell over said first subcell having a second band gap smaller than said first band gap; growing a first grading interlayer over said second solar subcell; (iii) growing a third solar subcell over said grading interlayer having a fourth band gap smaller than said second band gap such that said third solar subcell is lattice mismatched with respect to said second solar subcell; and
   etching the release layer so as to separate the multijunction first solar cell and the inverted metamorphic second solar cell.

2. A method as defined in claim 1, wherein the substrate is a germanium substrate, and forming a first multijunction solar cell further comprises forming a first photoactive junction in said substrate to form a bottom solar subcell;
   forming a gallium arsenide middle cell disposed on said substrate; and
   forming an indium gallium phosphide top cell disposed over said middle cell.

3. A method as defined in claim 1, further comprising:
   forming a second graded interlayer adjacent to said third solar subcell; said second graded interlayer having a fifth band gap greater than said fourth band gap;
   forming a lower fourth solar subcell adjacent to said second graded interlayer, said lower subcell having a sixth band gap smaller than said fourth band gap such that said fourth subcell is lattice mismatched with respect to said third subcell; and
   mounting a surrogate substrate on top of fourth solar subcell.

4. A method as defined in claim 3, wherein the lower fourth subcell has a band gap in the range of 0.6 to 0.8 eV; the third subcell has a band gap in the range of 0.9 to 1.1 eV, the second subcell has a band gap in the range of 1.35 to 1.45 eV, and the first subcell has a band gap in the range of 1.8 to 2.1 eV.

5. A method as defined in claim 1, wherein the surrogate substrate is composed of sapphire, GaAs, glass, Ge or Si.

6. A method as defined in claim 3, wherein the first graded interlayer is compositionally graded to lattice match the second subcell on one side and the third subcell on the other side, and the second graded interlayer is compositionally graded to lattice match the third subcell on one side and the bottom fourth subcell on the other side.

7. A method as defined in claim 1, wherein said first graded interlayer is composed of any of the As, P, N, Sb based III-V compound semiconductors subject to the constraints of having the in-plane lattice parameter greater or equal to that of the second subcell and less than or equal to that of the third subcell, and having a band gap energy greater than that of the second subcell and of the third subcell.

8. A method as defined in claim 3, wherein said second graded interlayer is composed of any of the As, P, N, Sb based III-V compound semiconductors subject to the constraints of having the in-plane lattice parameter greater or equal to that of the third subcell and less than or equal to that of the bottom fourth subcell, and having a band gap energy greater than that of the third subcell and of the fourth subcell.

9. A method as defined in claim 3, wherein the first and second graded interlayers are composed of $(In_xGa_{1-x})_yAl_{1-y}As$ with $0<x<1$, $0<y<1$, and x and y selected such that the band gap of each interlayer remains constant throughout its thickness.

10. A method as defined in claim 3, wherein the band gap of the first graded interlayer remains constant at 1.51 eV, and the band gap of the second graded interlayer remains constant at 1.1 eV.

11. A method as defined in claim 3, wherein the first subcell is composed of an InGaP emitter layer and an InGaP base layer, the second subcell is composed of InGaP emitter layer and a InGaAs base layer, the third subcell is composed of an InGaP emitter layer and an InGaAs base layer, and the bottom fourth subcell is composed of an InGaAs base layer and an InGaAs emitter layer lattice matched to the base layer.

12. A method as defined in claim 1, wherein the release layer is composed of AlAs or AlGaAs.

13. A method as defined in claim 1, wherein etching the release layers utilized a hydrofluoric wet etch.

14. A method as defined in claim 1, further comprising forming a semiconductor contact layer disposed over the lower subcell of the second solar cell, and depositing a metal layer disposed over the semiconductor contact layer.

15. A method as defined in claim 14, wherein the metal layer has a strain that is opposite in sign from the layers comprising the second solar cell.

16. A method as defined in claim 14, wherein the metal layer includes a first layer adjacent to the contact layer composed of titanium or nickel, and a second layer adjacent to the first layer composed of silver.

17. A method as defined in claim 14, wherein the metal layer is from 5 to 15 microns in thickness.

18. A method as defined in claim 15, wherein the deposition of the metal layer is controlled so that the deposited metal layer bows the adjacent semiconductor structure so the epitaxial layer deposited over the release layer are pulled away from the release layer.

19. A method as defined in claim 14, wherein the metal layer is deposited by e-beam evaporation and adjusting deposition parameters including deposition rate, substrate temperature, and layer thickness so as to introduce tensile rather than compressive stress.

20. A method as defined in claim 14, wherein the metal layer is composed of a sequence of layers including Ti/Pt/Ag, Ti/Ni/Ag, Ni/Pt/Ag, Cr/Ni/Ag, Ni/Ag, Cr/Ag, or Ti/Ag.

* * * * *